United States Patent
Komai

(10) Patent No.: US 11,011,211 B2
(45) Date of Patent: May 18, 2021

(54) SEMICONDUCTOR STORAGE DEVICE

(71) Applicant: KIOXIA CORPORATION, Tokyo (JP)

(72) Inventor: Hiromitsu Komai, Kamakura Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/804,956

(22) Filed: Feb. 28, 2020

(65) Prior Publication Data

US 2021/0065752 A1    Mar. 4, 2021

(30) Foreign Application Priority Data

Sep. 4, 2019 (JP) .............................. JP2019-161032

(51) Int. Cl.
| | |
|---|---|
| *G11C 7/06* | (2006.01) |
| *G11C 7/08* | (2006.01) |
| *G11C 7/12* | (2006.01) |
| *G11C 11/409* | (2006.01) |

(52) U.S. Cl.
CPC ................ *G11C 7/065* (2013.01); *G11C 7/08* (2013.01); *G11C 7/12* (2013.01); *G11C 11/409* (2013.01); *G11C 2207/2245* (2013.01)

(58) Field of Classification Search
CPC ......... G11C 7/065; G11C 7/12; G11C 11/409; G11C 7/08; G11C 2207/2245
See application file for complete search history.

(56) References Cited

U.S. PATENT DOCUMENTS

| | | | |
|---|---|---|---|
| 2015/0200015 A1* | 7/2015 | Kim ..................... | G11C 7/1042 |
| | | | 365/185.12 |
| 2015/0262630 A1 | 9/2015 | Shirakawa et al. | |
| 2017/0186484 A1* | 6/2017 | Takada ................ | G11C 11/5642 |
| 2017/0365335 A1* | 12/2017 | Wang ................. | G11C 16/0483 |
| 2018/0150400 A1* | 5/2018 | Agarwal ............. | G11C 11/5628 |
| 2019/0050169 A1* | 2/2019 | Komai ............... | G11C 16/0466 |
| 2019/0088340 A1* | 3/2019 | Shirakawa ............... | G11C 7/06 |

FOREIGN PATENT DOCUMENTS

JP    2015-176309 A    10/2015

OTHER PUBLICATIONS

U.S. Appl. No. 16/561,454.

* cited by examiner

*Primary Examiner* — Tri M Hoang
(74) *Attorney, Agent, or Firm* — Kim & Stewart LLP

(57) ABSTRACT

A semiconductor storage device includes a plurality of memory cells and a plurality of bit lines connected thereto, a plurality of sense amplifier units respectively connected to the plurality of bit lines, and a cache memory connected to the plurality of sense amplifier units. Each sense amplifier unit includes a sense node and a latch in which data transferred onto the sense node from a corresponding bit line is latched. First data latched in a first sense amplifier unit among the plurality of sense amplifier units is transferred to the cache memory, and second data latched in a second sense amplifier unit among the plurality of sense amplifier units is transferred to the sense node of the first second sense amplifier unit. Thereafter, the second data is latched in the first sense amplifier unit and transferred to the cache memory.

20 Claims, 23 Drawing Sheets

FIG. 13A

| | SEN | SDL |
|---|---|---|
| SAU15 | DAT15 | DAT15 |
| SAU14 | DAT14 | DAT14 |
| SAU13 | DAT13 | DAT13 |
| SAU12 | DAT12 | DAT12 |
| SAU11 | DAT11 | DAT11 |
| SAU10 | DAT10 | DAT10 |
| SAU9 | DAT9 | DAT9 |
| SAU8 | DAT8 | DAT8 |
| SAU7 | DAT7 | DAT7 |
| SAU6 | DAT6 | DAT6 |
| SAU5 | DAT5 | DAT5 |
| SAU4 | DAT4 | DAT4 |
| SAU3 | DAT3 | DAT3 |
| SAU2 | DAT2 | DAT2 |
| SAU1 | DAT1 | DAT1 |
| SAU0 | DAT0 | DAT0 |

| XDL2 | - |
|---|---|
| XDL1 | - |
| XDL0 | - | t100

FIG. 13B

| | SEN | SDL |
|---|---|---|
| SAU15 | DAT15 | DAT15 |
| SAU14 | DAT15 | DAT14 |
| SAU13 | DAT14 | DAT13 |
| SAU12 | DAT13 | DAT12 |
| SAU11 | DAT12 | DAT11 |
| SAU10 | DAT11 | DAT10 |
| SAU9 | DAT10 | DAT9 |
| SAU8 | DAT9 | DAT8 |
| SAU7 | DAT8 | DAT7 |
| SAU6 | DAT7 | DAT6 |
| SAU5 | DAT6 | DAT5 |
| SAU4 | DAT5 | DAT4 |
| SAU3 | DAT4 | DAT3 |
| SAU2 | DAT3 | DAT2 |
| SAU1 | DAT2 | DAT1 |
| SAU0 | DAT1 | DAT0 |

| XDL2 | - |
|---|---|
| XDL1 | - |
| XDL0 | DAT0 | t101

FIG. 13C

| | SEN | SDL |
|---|---|---|
| SAU15 | DAT15 | DAT15 |
| SAU14 | DAT15 | DAT15 |
| SAU13 | DAT14 | DAT14 |
| SAU12 | DAT13 | DAT13 |
| SAU11 | DAT12 | DAT12 |
| SAU10 | DAT11 | DAT11 |
| SAU9 | DAT10 | DAT10 |
| SAU8 | DAT9 | DAT9 |
| SAU7 | DAT8 | DAT8 |
| SAU6 | DAT7 | DAT7 |
| SAU5 | DAT6 | DAT6 |
| SAU4 | DAT5 | DAT5 |
| SAU3 | DAT4 | DAT4 |
| SAU2 | DAT3 | DAT3 |
| SAU1 | DAT2 | DAT2 |
| SAU0 | DAT1 | DAT1 |

| XDL2 | - |
|---|---|
| XDL1 | - |
| XDL0 | DAT0 | t103

FIG. 13D

| | SEN | SDL |
|---|---|---|
| SAU15 | DAT15 | DAT15 |
| SAU14 | DAT15 | DAT15 |
| SAU13 | DAT15 | DAT15 |
| SAU12 | DAT14 | DAT14 |
| SAU11 | DAT13 | DAT13 |
| SAU10 | DAT12 | DAT12 |
| SAU9 | DAT11 | DAT11 |
| SAU8 | DAT10 | DAT10 |
| SAU7 | DAT9 | DAT9 |
| SAU6 | DAT8 | DAT8 |
| SAU5 | DAT7 | DAT7 |
| SAU4 | DAT6 | DAT6 |
| SAU3 | DAT5 | DAT5 |
| SAU2 | DAT4 | DAT4 |
| SAU1 | DAT3 | DAT3 |
| SAU0 | DAT2 | DAT2 |

| XDL2 | - |
|---|---|
| XDL1 | DAT1 |
| XDL0 | DAT0 | t105

FIG. 19A

| | SAM_O | SAM_E |
|---|---|---|
| SAU15 | DAT15(O) | DAT15(E) |
| SAU14 | DAT14(O) | DAT14(E) |
| SAU13 | DAT13(O) | DAT13(E) |
| SAU12 | DAT12(O) | DAT12(E) |
| SAU11 | DAT11(O) | DAT11(E) |
| SAU10 | DAT10(O) | DAT10(E) |
| SAU9 | DAT9(O) | DAT9(E) |
| SAU8 | DAT8(O) | DAT8(E) |
| SAU7 | DAT7(O) | DAT7(E) |
| SAU6 | DAT6(O) | DAT6(E) |
| SAU5 | DAT5(O) | DAT5(E) |
| SAU4 | DAT4(O) | DAT4(E) |
| SAU3 | DAT3(O) | DAT3(E) |
| SAU2 | DAT2(O) | DAT2(E) |
| SAU1 | DAT1(O) | DAT1(E) |
| SAU0 | DAT0(O) | DAT0(E) |

| | CM_O | CM_E |
|---|---|---|
| XDL3 | - | - |
| XDL2 | - | - |
| XDL1 | - | - |
| XDL0 | - | - | t101

FIG. 19B

| | SAM_O | SAM_E |
|---|---|---|
| SAU15 | DAT15(E) | DAT14(E) |
| SAU14 | DAT15(O) | DAT13(E) |
| SAU13 | DAT14(O) | DAT12(E) |
| SAU12 | DAT13(O) | DAT11(E) |
| SAU11 | DAT12(O) | DAT10(E) |
| SAU10 | DAT11(O) | DAT9(E) |
| SAU9 | DAT10(O) | DAT8(E) |
| SAU8 | DAT9(O) | DAT7(E) |
| SAU7 | DAT8(O) | DAT6(E) |
| SAU6 | DAT7(O) | DAT5(E) |
| SAU5 | DAT6(O) | DAT4(E) |
| SAU4 | DAT5(O) | DAT3(E) |
| SAU3 | DAT4(O) | DAT2(E) |
| SAU2 | DAT3(O) | DAT1(E) |
| SAU1 | DAT2(O) | DAT0(E) |
| SAU0 | DAT1(O) | DAT0(O) |

| | CM_O | CM_E |
|---|---|---|
| XDL3 | - | - |
| XDL2 | - | - |
| XDL1 | - | - |
| XDL0 | DAT0(O) | - | t105

FIG. 19C

| | SAM_O | SAM_E |
|---|---|---|
| SAU15 | DAT14(E) | DAT13(E) |
| SAU14 | DAT15(E) | DAT12(E) |
| SAU13 | DAT15(O) | DAT11(E) |
| SAU12 | DAT14(O) | DAT10(E) |
| SAU11 | DAT13(O) | DAT9(E) |
| SAU10 | DAT12(O) | DAT8(E) |
| SAU9 | DAT11(O) | DAT7(E) |
| SAU8 | DAT10(O) | DAT6(E) |
| SAU7 | DAT9(O) | DAT5(E) |
| SAU6 | DAT8(O) | DAT4(E) |
| SAU5 | DAT7(O) | DAT3(E) |
| SAU4 | DAT6(O) | DAT2(E) |
| SAU3 | DAT5(O) | DAT1(E) |
| SAU2 | DAT4(O) | DAT0(E) |
| SAU1 | DAT3(O) | DAT0(O) |
| SAU0 | DAT2(O) | DAT1(O) |

| | CM_O | CM_E |
|---|---|---|
| XDL3 | - | - |
| XDL2 | - | - |
| XDL1 | DAT1(O) | - |
| XDL0 | DAT0(O) | - | t109

FIG. 19D

| | SAM_O | SAM_E |
|---|---|---|
| SAU15 | DAT13(E) | DAT12(E) |
| SAU14 | DAT14(E) | DAT11(E) |
| SAU13 | DAT15(E) | DAT10(E) |
| SAU12 | DAT15(O) | DAT9(E) |
| SAU11 | DAT14(O) | DAT8(E) |
| SAU10 | DAT13(O) | DAT7(E) |
| SAU9 | DAT12(O) | DAT6(E) |
| SAU8 | DAT11(O) | DAT5(E) |
| SAU7 | DAT10(O) | DAT4(E) |
| SAU6 | DAT9(O) | DAT3(E) |
| SAU5 | DAT8(O) | DAT2(E) |
| SAU4 | DAT7(O) | DAT1(E) |
| SAU3 | DAT6(O) | DAT0(E) |
| SAU2 | DAT5(O) | DAT0(O) |
| SAU1 | DAT4(O) | DAT1(O) |
| SAU0 | DAT3(O) | DAT2(O) |

| | CM_O | CM_E |
|---|---|---|
| XDL3 | - | - |
| XDL2 | DAT2(O) | - |
| XDL1 | DAT1(O) | - |
| XDL0 | DAT0(O) | - | t113

FIG. 21A

| | SEN | SDL |
|---|---|---|
| SAU8 | DAT8 | DAT8 |
| SAU7 | DAT7 | DAT7 |
| SAU9 | DAT9 | DAT9 |
| SAU6 | DAT6 | DAT6 |
| SAU10 | DAT10 | DAT10 |
| SAU5 | DAT5 | DAT5 |
| SAU11 | DAT11 | DAT11 |
| SAU4 | DAT4 | DAT4 |
| SAU12 | DAT12 | DAT12 |
| SAU3 | DAT3 | DAT3 |
| SAU13 | DAT13 | DAT13 |
| SAU2 | DAT2 | DAT2 |
| SAU14 | DAT14 | DAT14 |
| SAU1 | DAT1 | DAT1 |
| SAU15 | DAT15 | DAT15 |
| SAU0 | DAT0 | DAT0 |

| XDL2 | - |
|---|---|
| XDL1 | - |
| XDL0 | - | t100

FIG. 21B

| | SEN | SDL |
|---|---|---|
| SAU8 | DAT9 | DAT8 |
| SAU7 | DAT8 | DAT7 |
| SAU9 | DAT10 | DAT9 |
| SAU6 | DAT7 | DAT6 |
| SAU10 | DAT11 | DAT10 |
| SAU5 | DAT6 | DAT5 |
| SAU11 | DAT12 | DAT11 |
| SAU4 | DAT5 | DAT4 |
| SAU12 | DAT13 | DAT12 |
| SAU3 | DAT4 | DAT3 |
| SAU13 | DAT14 | DAT13 |
| SAU2 | DAT3 | DAT2 |
| SAU14 | DAT15 | DAT14 |
| SAU1 | DAT2 | DAT1 |
| SAU15 | DAT0 | DAT15 |
| SAU0 | DAT1 | DAT0 |

| XDL2 | - |
|---|---|
| XDL1 | - |
| XDL0 | DAT0 | t101

FIG. 21C

| | SEN | SDL |
|---|---|---|
| SAU8 | DAT9 | DAT9 |
| SAU7 | DAT8 | DAT8 |
| SAU9 | DAT10 | DAT10 |
| SAU6 | DAT7 | DAT7 |
| SAU10 | DAT11 | DAT11 |
| SAU5 | DAT6 | DAT6 |
| SAU11 | DAT12 | DAT12 |
| SAU4 | DAT5 | DAT5 |
| SAU12 | DAT13 | DAT13 |
| SAU3 | DAT4 | DAT4 |
| SAU13 | DAT14 | DAT14 |
| SAU2 | DAT3 | DAT3 |
| SAU14 | DAT15 | DAT15 |
| SAU1 | DAT2 | DAT2 |
| SAU15 | DAT0 | DAT0 |
| SAU0 | DAT1 | DAT1 |

| XDL2 | - |
|---|---|
| XDL1 | - |
| XDL0 | DAT0 | t103

FIG. 21D

| | SEN | SDL |
|---|---|---|
| SAU8 | DAT10 | DAT9 |
| SAU7 | DAT9 | DAT8 |
| SAU9 | DAT11 | DAT10 |
| SAU6 | DAT8 | DAT7 |
| SAU10 | DAT12 | DAT11 |
| SAU5 | DAT7 | DAT6 |
| SAU11 | DAT13 | DAT12 |
| SAU4 | DAT6 | DAT5 |
| SAU12 | DAT14 | DAT13 |
| SAU3 | DAT5 | DAT4 |
| SAU13 | DAT15 | DAT14 |
| SAU2 | DAT4 | DAT3 |
| SAU14 | DAT0 | DAT15 |
| SAU1 | DAT3 | DAT2 |
| SAU15 | DAT1 | DAT0 |
| SAU0 | DAT2 | DAT1 |

| XDL2 | - |
|---|---|
| XDL1 | DAT1 |
| XDL0 | DAT0 | t105

SEMICONDUCTOR STORAGE DEVICE

CROSS-REFERENCE TO RELATED APPLICATION(S)

This application is based upon and claims the benefit of priority from Japanese Patent Application No. 2019-161032, filed Sep. 4, 2019, the entire contents of which are incorporated herein by reference.

FIELD

Embodiments described herein relate generally to a semiconductor storage device.

BACKGROUND

A semiconductor storage device that includes a memory cell array including a plurality of memory cells and a plurality of bit lines respectively connected to the plurality of memory cells, and a plurality of sense amplifier units respectively connected to the plurality of bit lines is known.

DESCRIPTION OF THE DRAWINGS

FIGS. 13A to 13D are schematic tables illustrating the read operation.

FIGS. 19A to 19D are schematic tables illustrating a read operation.

FIGS. 21A to 21D are schematic tables illustrating a read operation.

DETAILED DESCRIPTION

Figure 1:
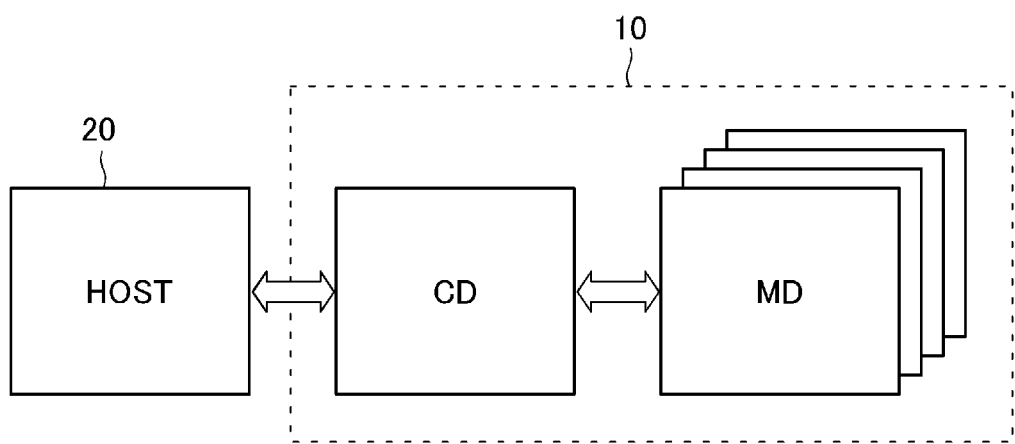
FIG. 1 is a schematic block diagram showing a configuration of a memory system according to a first embodiment.

Embodiments provide a semiconductor storage device capable of operating at a high speed.

In general, according to one embodiment, a semiconductor storage device includes a memory cell array. The memory cell array includes a plurality of memory cells and a plurality of bit lines respectively connected to the plurality of memory cells. The semiconductor storage device includes a plurality of sense amplifier units that are respectively connected to the plurality of bit lines. Each sense amplifier unit includes a first transistor connected to one of the bit lines, a second transistor connected to the first transistor via a first wiring, a sense transistor including a gate electrode connected to the second transistor via a second wiring, a third wiring connected to the sense transistor, a first latch circuit connected to the third wiring, and a voltage transfer circuit configured to conduct the first wiring to a first voltage supply line or a second voltage supply line according to a value latched by the first latch circuit. The semiconductor storage device further includes a fourth wiring commonly connected to the third wirings of the plurality of sense amplifier units, a cache memory including a fifth wiring connected to the fourth wiring and a plurality of second latch circuits connected to the fifth wiring, a third transistor connected to the first wiring of a first sense amplifier unit among the plurality of sense amplifier units and the fifth wiring of the cache memory, and a fourth transistor connected to the first wiring of a second sense amplifier unit among the plurality of sense amplifier units and the second wiring of the first sense amplifier unit.

Next, a semiconductor storage device according to an embodiment will be described in detail with reference to the drawings. The following embodiments are merely examples, and are not intended to limit the scope of the present disclosure.

In this specification, when a term "semiconductor storage device" is mentioned, the semiconductor storage device may mean a memory die, or a memory system that includes a control die such as a memory chip, a memory card, and an SSD. Furthermore, the semiconductor storage device may mean a configuration that includes a host computer, such as a smart phone, a tablet terminal, and a personal computer.

In this specification, when it is described that a first configuration is "electrically connected" to a second configuration, the first configuration may be directly connected to the second configuration, or the first configuration may be connected to the second configuration via a wiring, a semiconductor element, a transistor, or the like. For example, when three transistors are connected in series, even if a second transistor is in an OFF state, a first transistor is regarded as "electrically connected" to a third transistor.

In this specification, when it is described that the first configuration is "connected between" the second configuration and a third configuration, the expression may mean that the first configuration, the second configuration, and the third configuration are connected in series, and the first configuration is provided in a current path of the second configuration and the third configuration.

In this specification, when it is described that a circuit or the like "conducts" two wirings or the like, the expression may mean that, for example, this circuit or the like includes a transistor or the like, this transistor or the like is provided in a current path between two wirings, and this transistor is in an ON state.

First Embodiment

[Memory System 10]

FIG. 1 is a schematic block diagram showing a configuration of a memory system 10 according to a first embodiment.

The memory system 10 reads, writes, and erases user data in accordance with signals transmitted from a host computer 20. The memory system 10 is, for example, a memory chip, a memory card, an SSD, or another system capable of storing user data. The memory system 10 includes a plurality of memory dies MD that store the user data, and a control die CD connected to the plurality of memory dies MD and the host computer 20. The control die CD includes, for example, a processor, a RAM, a ROM, and an ECC circuit or the like, and performs processing such as conversion between a logical address and a physical address, bit error detection/correction, and wear leveling.

Figure 2:
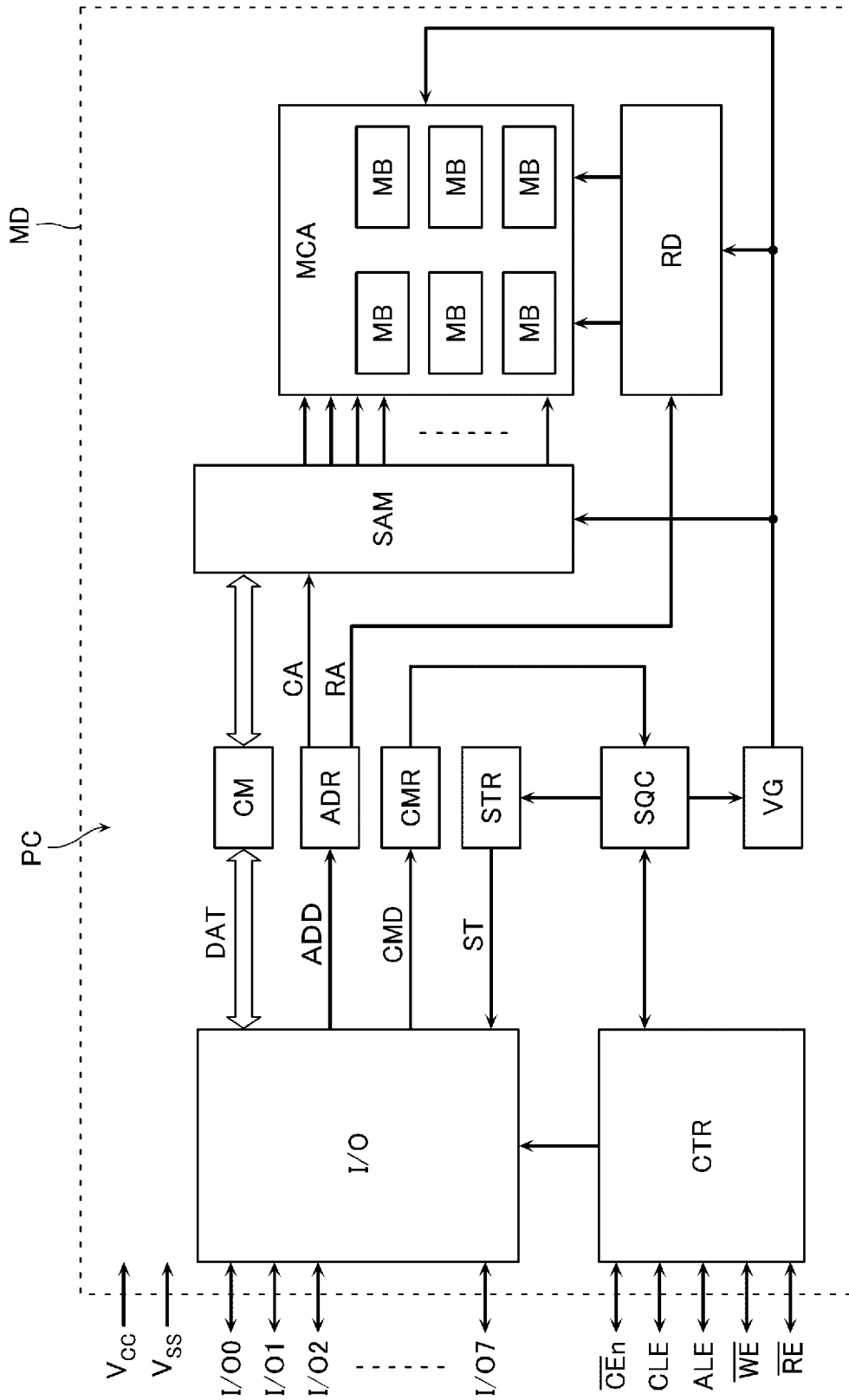
FIG. 2 is a schematic block diagram showing a configuration of a memory die.
Figure 3:
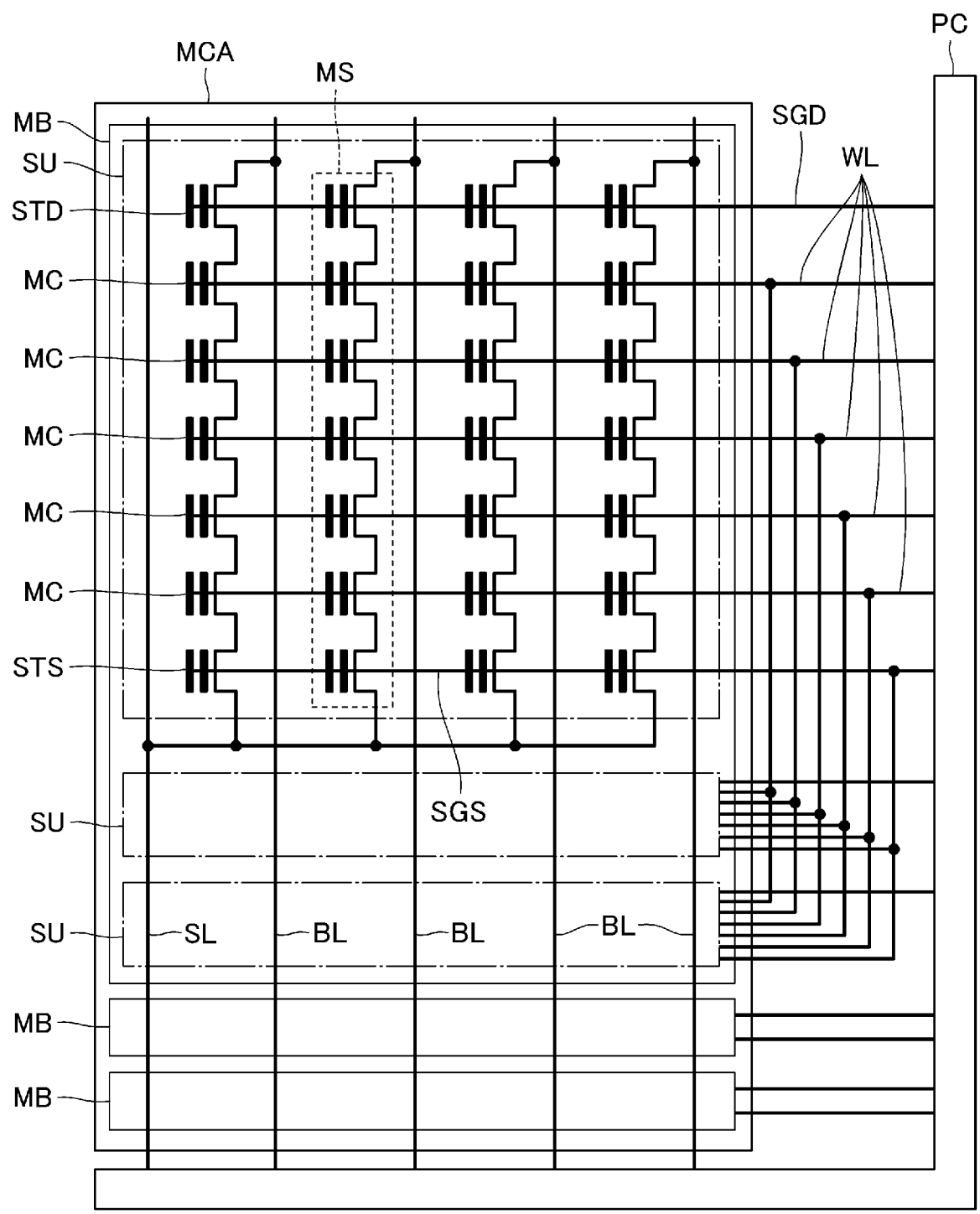
FIG. 3 is a schematic circuit diagram showing a configuration of a memory cell array.
Figure 4:
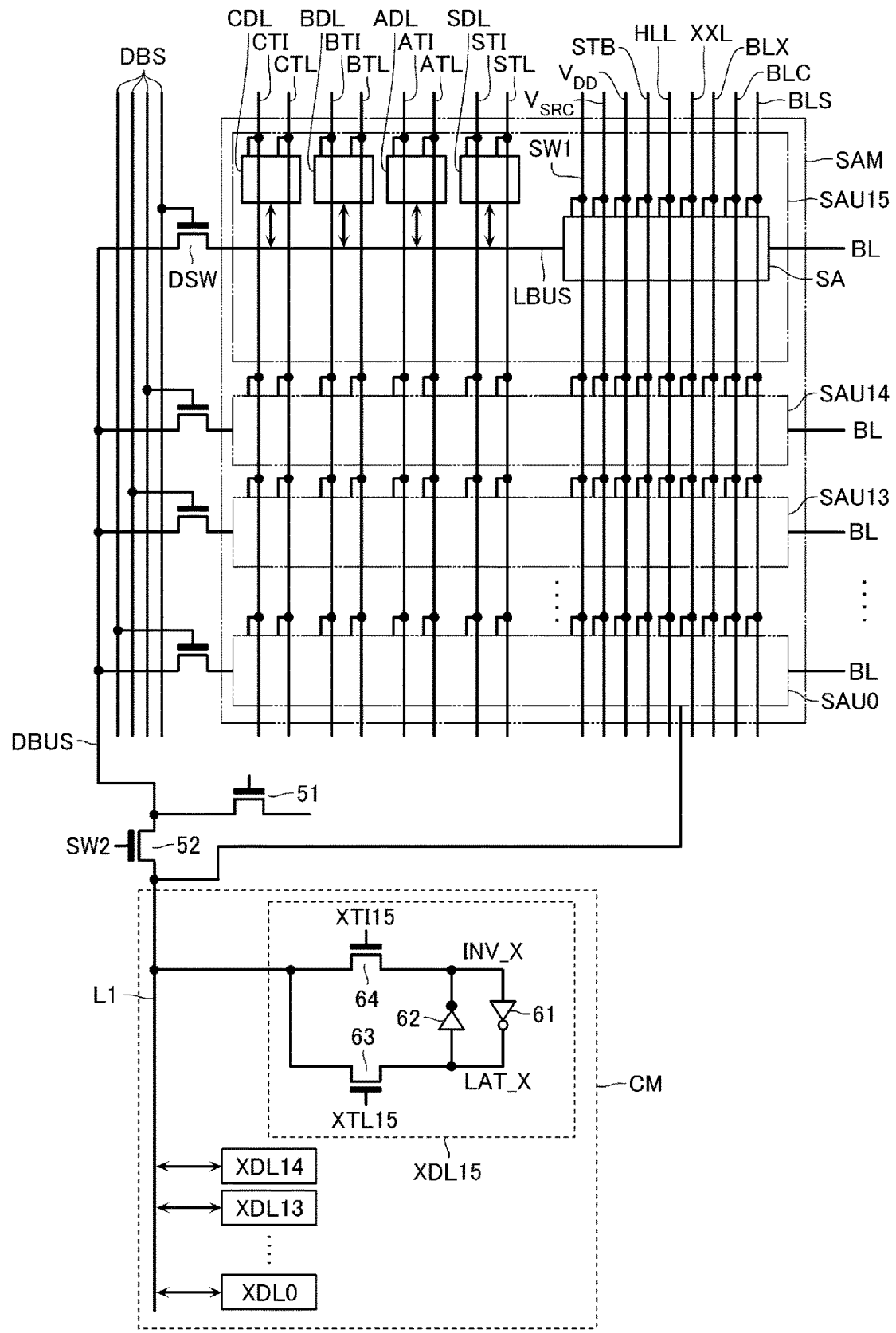
FIG. 4 is a schematic circuit diagram showing a configuration of a sense amplifier module.
Figure 5:
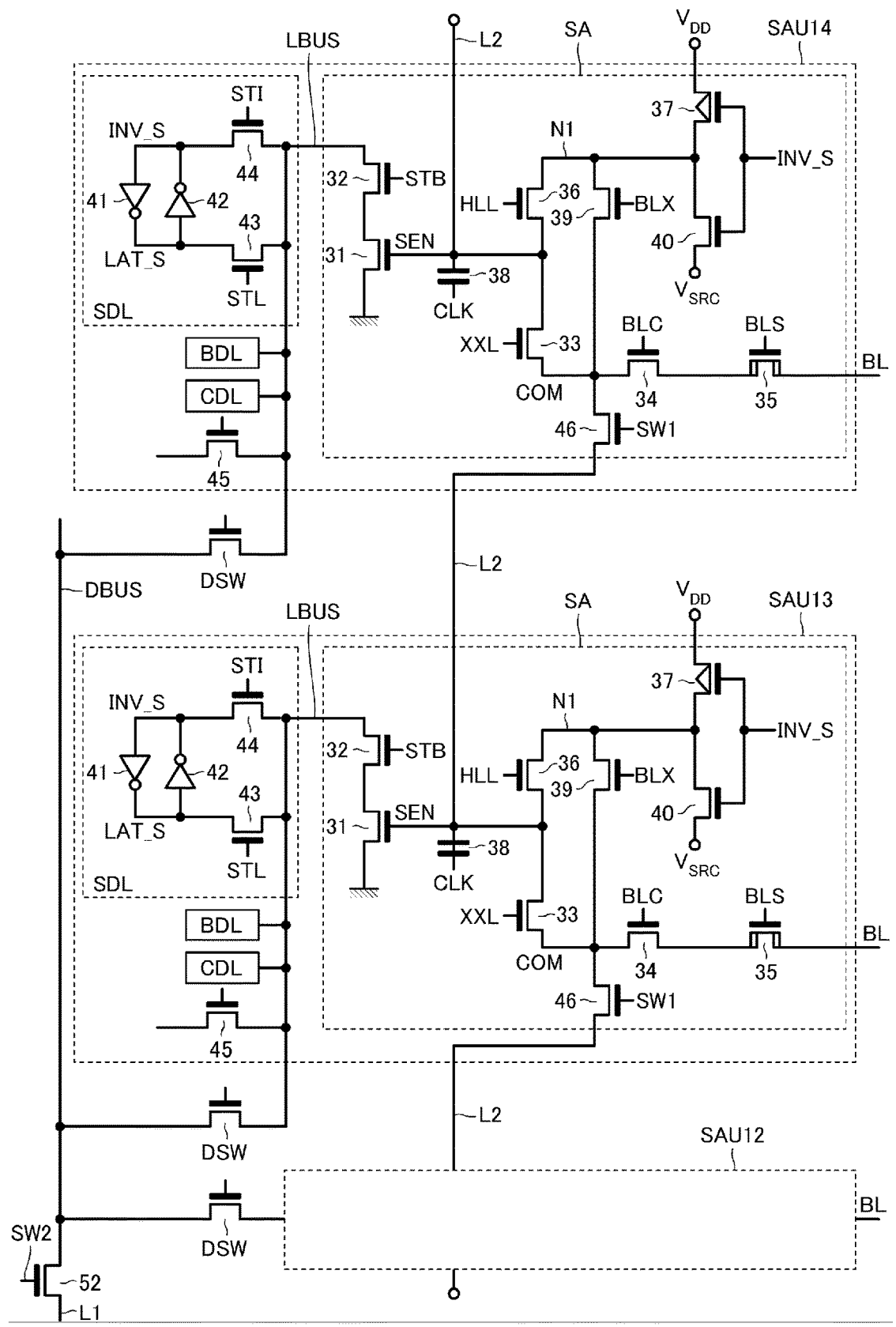
FIG. 5 is a schematic circuit diagram showing a configuration of a sense amplifier.

FIG. 2 is a schematic block diagram showing a configuration of a memory die MD according to a first embodiment. FIGS. 3 to 5 are schematic circuit diagrams showing a partial configuration of the memory die MD.

As shown in FIG. 2, the memory die MD includes a memory cell array MCA that stores data, and a peripheral circuit PC connected to the memory cell array MCA.

[Memory Cell Array MCA]

The memory cell array MCA includes a plurality of memory blocks MB. Each of the plurality of memory blocks MB includes a plurality of string units SU as shown in FIG. 3. Each of the plurality of string units SU includes a plurality of memory strings MS. An end of each of the plurality of memory strings MS is connected to the peripheral circuit PC via a bit line BL. Another end of each of the plurality of memory strings MS is connected to the peripheral circuit PC via a common source line SL.

Each of the memory strings MS includes a drain select transistor STD, a plurality of memory cells MC, and a source select transistor STS that are connected in series between the bit line BL and the source line SL. Hereinafter, the drain select transistor STD and the source select transistor STS may be simply referred to as select transistors (STD, STS).

Each of the memory cells MC according to this embodiment is a field effect transistor, and also may be referred to as a memory transistor, that includes a semiconductor layer that functions as a channel region, a gate insulation film that includes a charge storage film, and a gate electrode. A threshold voltage of the memory cells MC changes according to an amount of charge in the charge storage film. The memory cell MC stores 1 bit or a plurality of bits of data. A different word line WL is connected to each gate electrode of the plurality of memory cells MC corresponding to one memory string MS. Each of these word lines WL is commonly connected to all the memory strings MS in one memory block MB.

The select transistors (STD, STS) are field effect transistors that each include the semiconductor layer that functions as the channel region, the gate insulation film, and the gate electrode. Select gate lines (SGD, SGS) are connected to the gate electrodes of the select transistors (STD, STS), respectively. A drain select line SGD is provided corresponding to the string unit SU, and is commonly connected to all the memory strings MS in one string unit SU. A source select line SGS is commonly connected to all the memory strings MS in one memory block MB.

[Peripheral Circuit PC]

As shown in FIG. 2, the peripheral circuit PC includes a row decoder RD, a sense amplifier module SAM, a cache memory CM, a voltage generation circuit VG, and a sequencer SQC. The peripheral circuit PC includes an address register ADR, a command register CMR, and a status register STR. The peripheral circuit PC includes an input and output control circuit I/O and a logic circuit CTR.

The row decoder RD includes, for example, a decode circuit and a switch circuit. The decode circuit decodes a row address RA latched in the address register ADR. The switch circuit conducts the word lines WL and the select gate lines (SGD, SGS) corresponding to the row address RA with a corresponding voltage supply line according to an output signal of the decode circuit.

As shown in FIG. 4, the sense amplifier module SAM includes a plurality of sense amplifier units SAU0 to SAU15 corresponding to the plurality of bit lines BL. Each of the sense amplifier units SAU0 to SAU15 includes a sense amplifier SA connected to one of the bit lines BL, a wiring LBUS connected to the sense amplifier SA, latch circuits SDL, ADL, BDL, CDL connected to the wiring LBUS, and a charge transistor 45 for precharging (FIG. 5) connected to the wiring LBUS. The wirings LBUS in the sense amplifier units SAU0 to SAU15 are connected to the wiring DBUS via a switch transistor DSW. A charge transistor 51 for precharging is connected to the wiring DBUS.

As shown in FIG. 5, the sense amplifier SA includes a sense transistor 31 that discharges charge of the wiring LBUS according to a current flowing through the bit line BL. A source electrode of the sense transistor 31 is connected to a ground voltage supply terminal. A drain electrode is connected to the wiring LBUS via a switch transistor 32. A gate electrode is connected to the bit line BL via a sense node SEN, a discharge transistor 33, a node COM, a clamp transistor 34, and a high breakdown voltage transistor 35. The sense node SEN is connected to an internal control signal CLK via a capacitor 38.

The sense amplifier SA includes a voltage transfer circuit that selectively conducts the node COM and the sense node SEN to a voltage supply line $V_{DD}$ or a voltage supply line $V_{SRC}$ according to a value latched by a latch circuit SDL. This voltage transfer circuit includes a node N1, a charge transistor 36 connected between the node N1 and the sense node SEN, a charge transistor 39 connected between the node N1 and the node COM, a charge transistor 37 connected between the node N1 and the voltage supply line $V_{DD}$, and a discharge transistor 40 connected between the node N1 and the voltage supply line $V_{SRC}$. Gate electrodes of the charge transistor 37 and the discharge transistor 40 are commonly connected to a node INV_S of the latch circuit SDL.

As illustrated in FIG. 5, the sense node SEN in a sense amplifier unit SAU13 is connected to the node COM in a sense amplifier unit SAU14 via a wiring L2 and a switch transistor 46. Similarly, the sense node SEN in a sense amplifier unit SAUk (k is an integer of 0 or more and 14 or less) is connected to the node COM in a sense amplifier unit SAUk+1 via the wiring L2 and the switch transistor 46.

The sense transistor 31, the switch transistor 32, the discharge transistor 33, the clamp transistor 34, the charge transistor 36, the charge transistor 39, the discharge transistor 40, and the switch transistor 46 are, for example, enhancement-type NMOS transistors. The high breakdown voltage transistor 35 is, for example, a depletion-type NMOS transistor. The charge transistor 37 is, for example, a PMOS transistor.

A gate electrode of the switch transistor 32 is connected to a signal line STB. A gate electrode of the discharge transistor 33 is connected to a signal line XXL. A gate electrode of the clamp transistor 34 is connected to a signal line BLC. A gate electrode of the voltage resistant transistor 35 is connected to a signal line BLS. A gate electrode of the charge transistor 36 is connected to a signal line HLL. A gate electrode of the charge transistor 39 is connected to a signal line BLX. A gate electrode of the switch transistor 46 is connected to a signal line SW1. These signal lines STB, XXL, BLC, BLS, HLL, BLX and SW1 are connected to the sequencer SQC.

The latch circuit SDL includes nodes LAT_S and INV_S, inverters 41 and 42 connected in parallel between these nodes LAT_S and INV_S, a switch transistor 43 connected between the node LAT_S and the wiring LBUS, and a switch transistor 44 connected between the node INV_S and the wiring LBUS. The switch transistors 43 and 44 are, for example, NMOS transistors. A gate electrode of the switch transistor 43 is connected to the sequencer SQC via a signal line STI. A gate electrode of the switch transistor 44 is connected to the sequencer SQC via a signal line STL.

The latch circuits ADL, BDL, and CDL are configured in a substantially similar manner as the latch circuit SDL. However, as described above, the node INV_S of the latch circuit SDL is conducted to the gate electrodes of the charge transistor 37 and the discharge transistor 40 in the sense amplifier SA. The latch circuits ADL, BDL, and CDL are different from the latch circuit SDL in this aspect.

The switch transistor DSW is, for example, an NMOS transistor. The switch transistor DSW is connected between the wiring LBUS and the wiring DBUS. A gate electrode of the switch transistor DSW is connected to the sequencer SQC via a signal line DBS (FIG. 4).

As shown in FIG. 4, the signal lines STB, HLL, XXL, BLX, BLC, BLS and SW1 are commonly connected among all the sense amplifier units SAU in the sense amplifier module SAM, respectively. The voltage supply line $V_{DD}$ and the voltage supply line $V_{SRC}$ described above are commonly connected among all the sense amplifier units SAU in the sense amplifier module SAM, respectively. The signal line STI and the signal line STL of the latch circuit SDL are commonly connected among all the sense amplifier units SAU in the sense amplifier module SAM, respectively. Similarly, the signal lines ATI, ATL, BTI, BTL, CTI, and CTL in the latch circuits ADL, BDL, and CDL corresponding to the signal line STI and the signal line STL in the latch circuit SDL are commonly connected among all the sense amplifier units SAU in the sense amplifier module SAM, respectively. On the other hand, a plurality of signal lines DBS mentioned above are provided corresponding to all the sense amplifier units SAU in the sense amplifier module SAM, respectively.

For example, as shown in FIG. 4, the cache memory CM includes a wiring L1 connected to the wiring DBUS and latch circuits XDL0 to XDL15 connected to the wiring L1. Data stored in the latch circuits XDL0 to XDL15 are sequentially transferred to the sense amplifier module SAM or the input and output control circuit I/O via the wiring L1.

The wiring L1 is connected to the wiring DBUS via a switch transistor 52. A gate electrode of the switch transistor 52 is connected to the sequencer SQC via a signal line SW2.

Each of the latch circuits XDL0 to XDL15 includes nodes LAT_X and INV_X, inverters 61 and 62 connected in parallel between these nodes LAT_X and INV_X, a switch transistor 63 connected between the node LAT_X and the wiring L1, and a switch transistor 64 connected between the node INV_X and the wiring L1. The switch transistors 63 and 64 are, for example, NMOS transistors. A gate electrode of the switch transistor 63 is connected to the sequencer SQC via a corresponding one of signal lines XTI0 to XTI15. A gate electrode of the switch transistor 64 is connected to the sequencer SQC via a corresponding one of the signal lines XTL0 to XTL15.

As illustrated in FIG. 4, the wiring L1 is connected to the node COM in the sense amplifier unit SAU0 via the switch transistor 46 (FIG. 5) in the sense amplifier unit SAU0.

The voltage generation circuit VG (FIG. 2) includes, for example, a step-up circuit such as a charge pump circuit, a step-down circuit such as a regulator, and a plurality of voltage supply lines (not shown). The step-up circuit and the step-down circuit are connected to power supply voltage supply terminals $V_{CC}$ and $V_{SS}$, respectively. The voltage generation circuit VG boosts or lowers a voltage between the power supply voltage supply terminals $V_{CC}$ and $V_{SS}$ according to an internal control signal from the sequencer SQC, generates a plurality of operation voltages supplied to the bit lines BL, the source line SL, the word lines WL, and the select gate lines (SGD, SGS) according to a read sequence, a write sequence, and an erase sequence with respect to the memory cell array MCA, and outputs the plurality of operation voltages simultaneously from the plurality of voltage supply lines.

The sequencer SQC sequentially decodes command data CMD latched in the command register CMR, and outputs an internal control signal to the row decoder RD, the sense amplifier module SAM, and the voltage generation circuit VG. The sequencer SQC appropriately outputs status data indicating a state thereof to a status register STR. For example, when the write sequence or the erase sequence is executed, information indicating whether the write sequence or the erase sequence is normally completed is output as the status data.

The input and output control circuit I/O includes data input and output terminals I/O0 to I/O7, a shift register connected to these data input and output terminals I/O0 to I/O7, and a FIFO buffer connected to this shift register. The input and output control circuit I/O outputs data input from the data input and output terminals I/O0 to I/O7 to the latch circuit XDL in the cache memory CM, the address register ADR or the command register CMR according to an internal control signal from the logic circuit CTR. Data input from the latch circuit XDL or the status register STR is output to the data input and output terminals I/O0 to I/O7.

The logic circuit CTR receives an external control signal from a control die CD via external control terminals /CEn, CLE, ALE, /WE, /RE, and, in response, outputs an internal control signal to the input and output control circuit I/O.

Configuration Example

Figure 6:
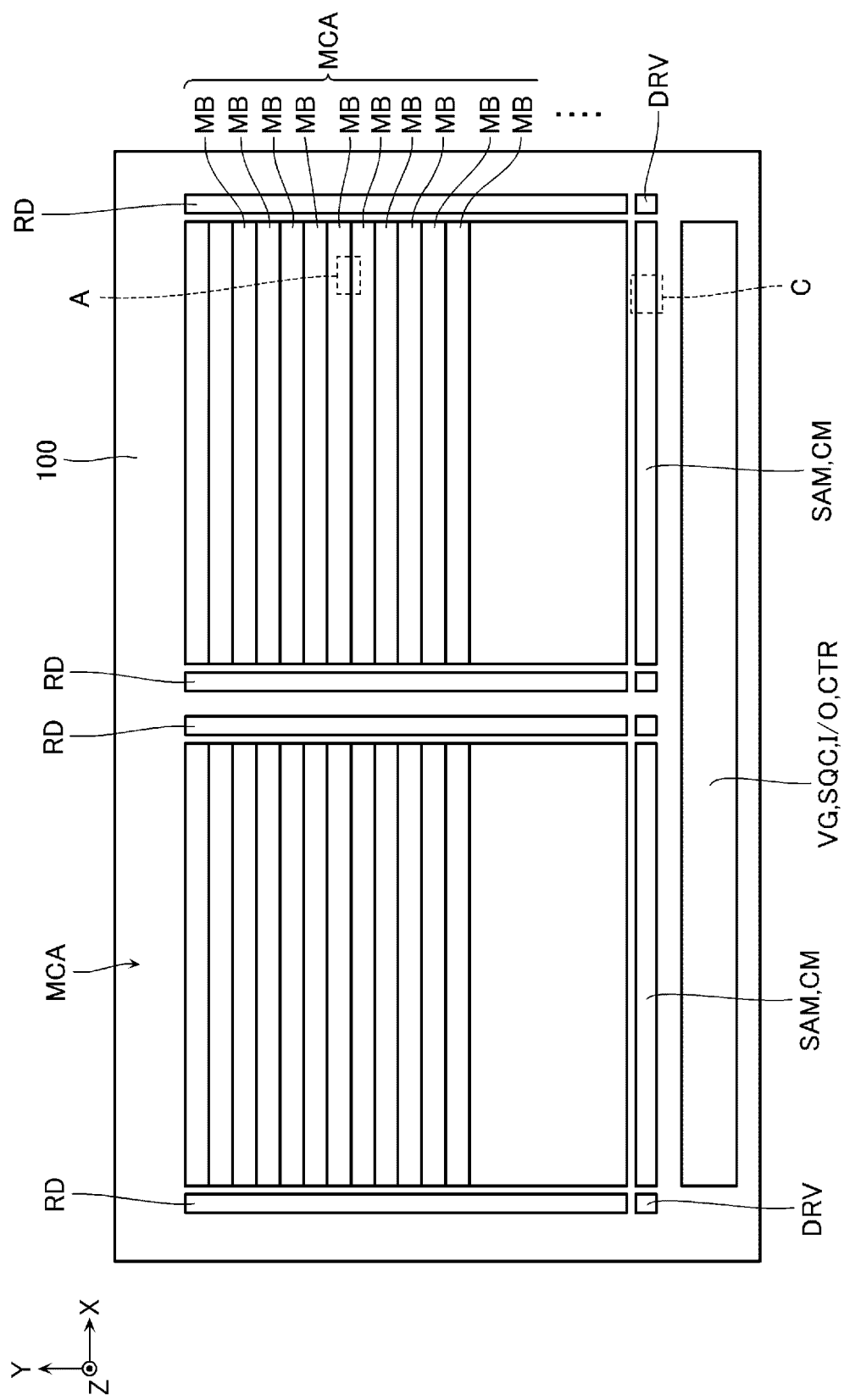
FIG. 6 is a schematic plan view showing the configuration of the memory die.
Figure 7:
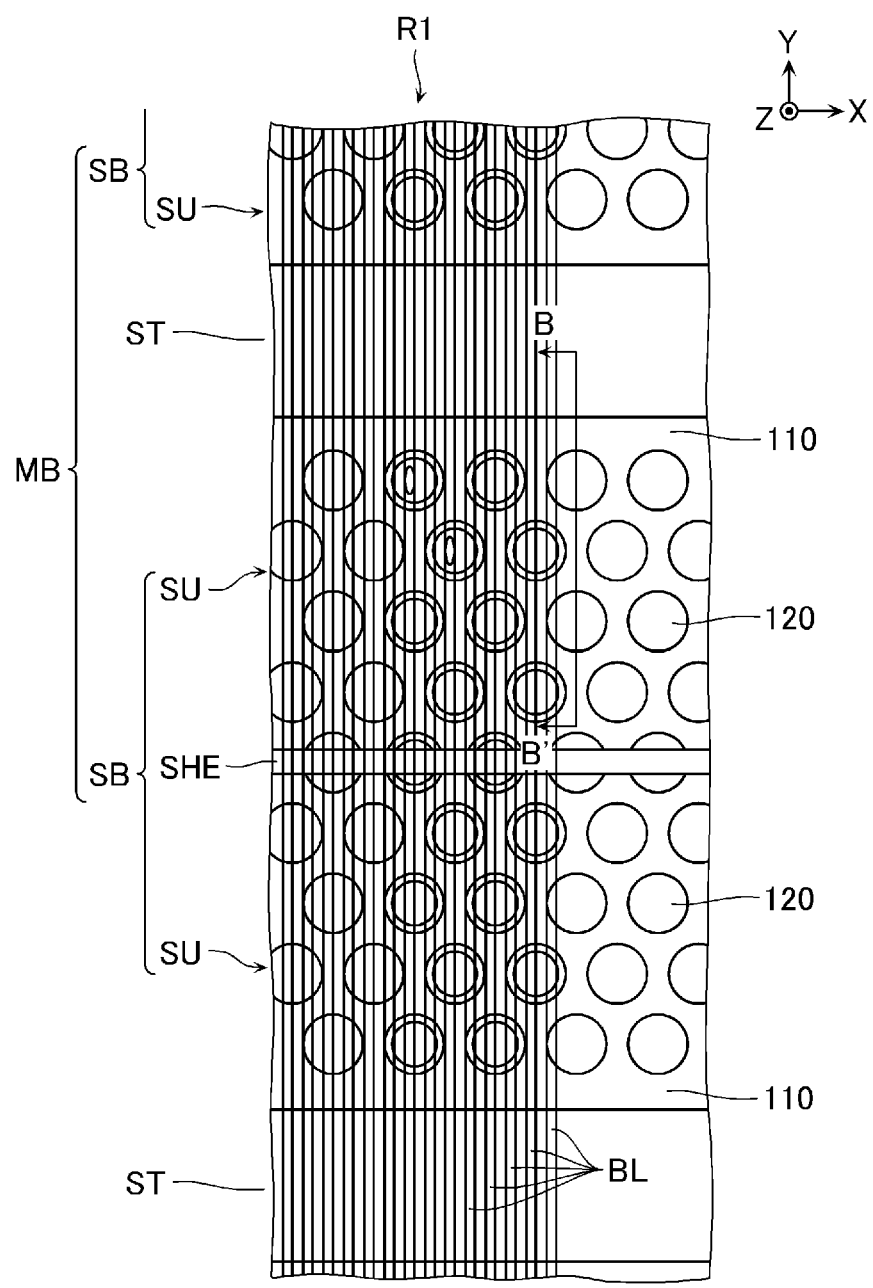
FIG. 7 is a schematic plan view showing the configuration of the memory cell array.
Figure 8:
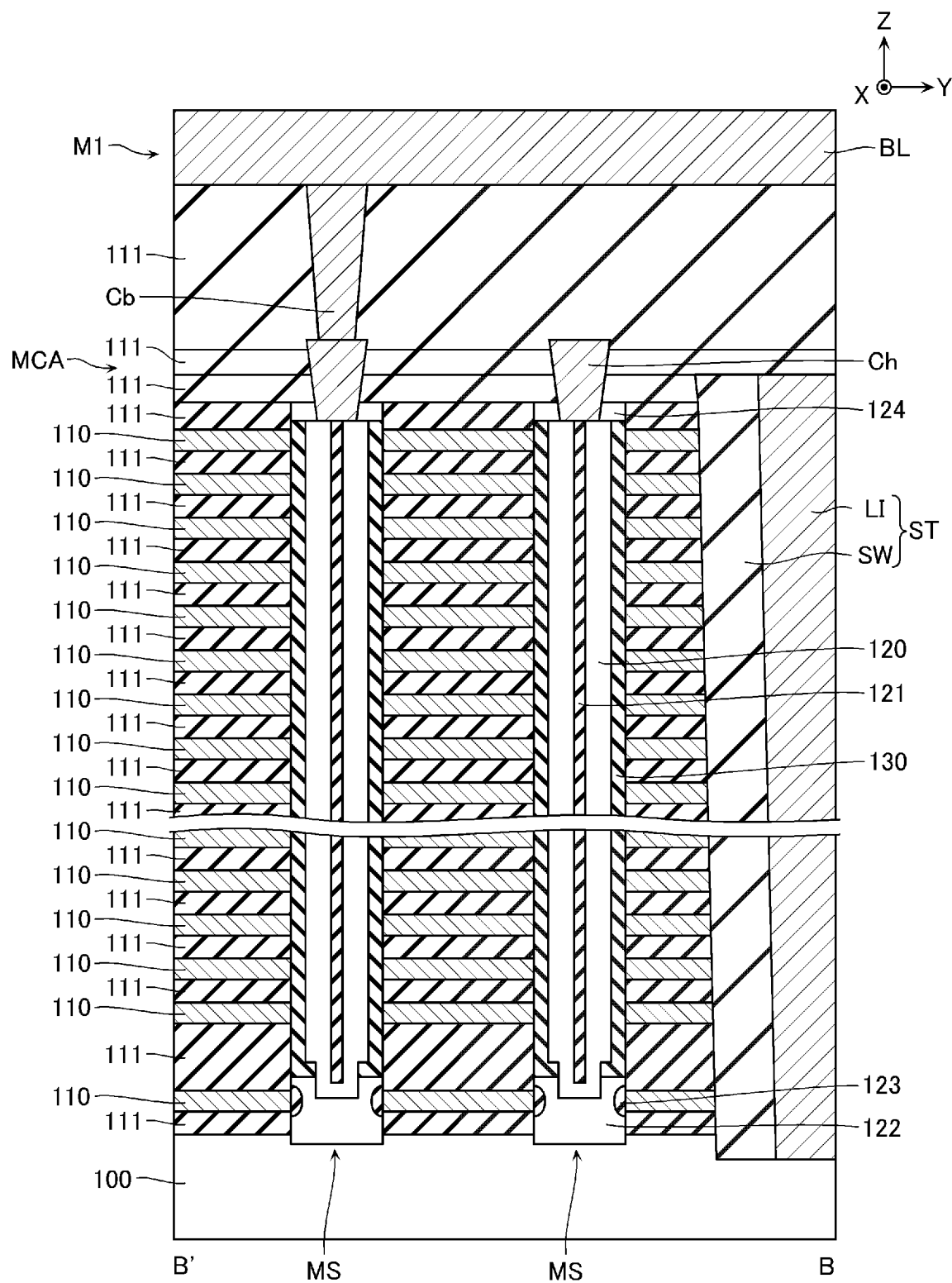
FIG. 8 is a schematic cross-sectional view showing the configuration of the memory cell array.
Figure 9:
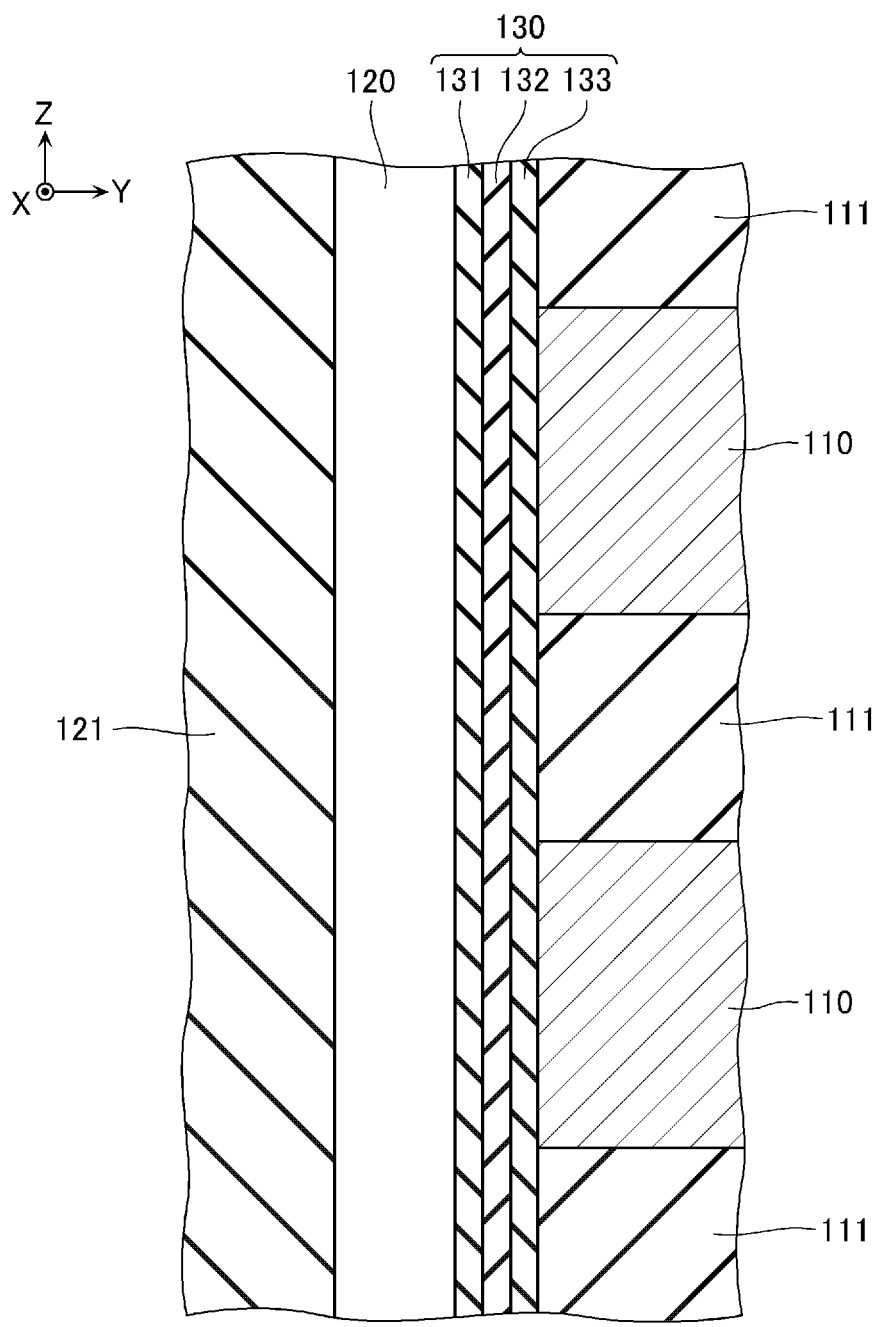
FIG. 9 is a schematic cross-sectional view showing a configuration of a memory cell.
Figure 10:
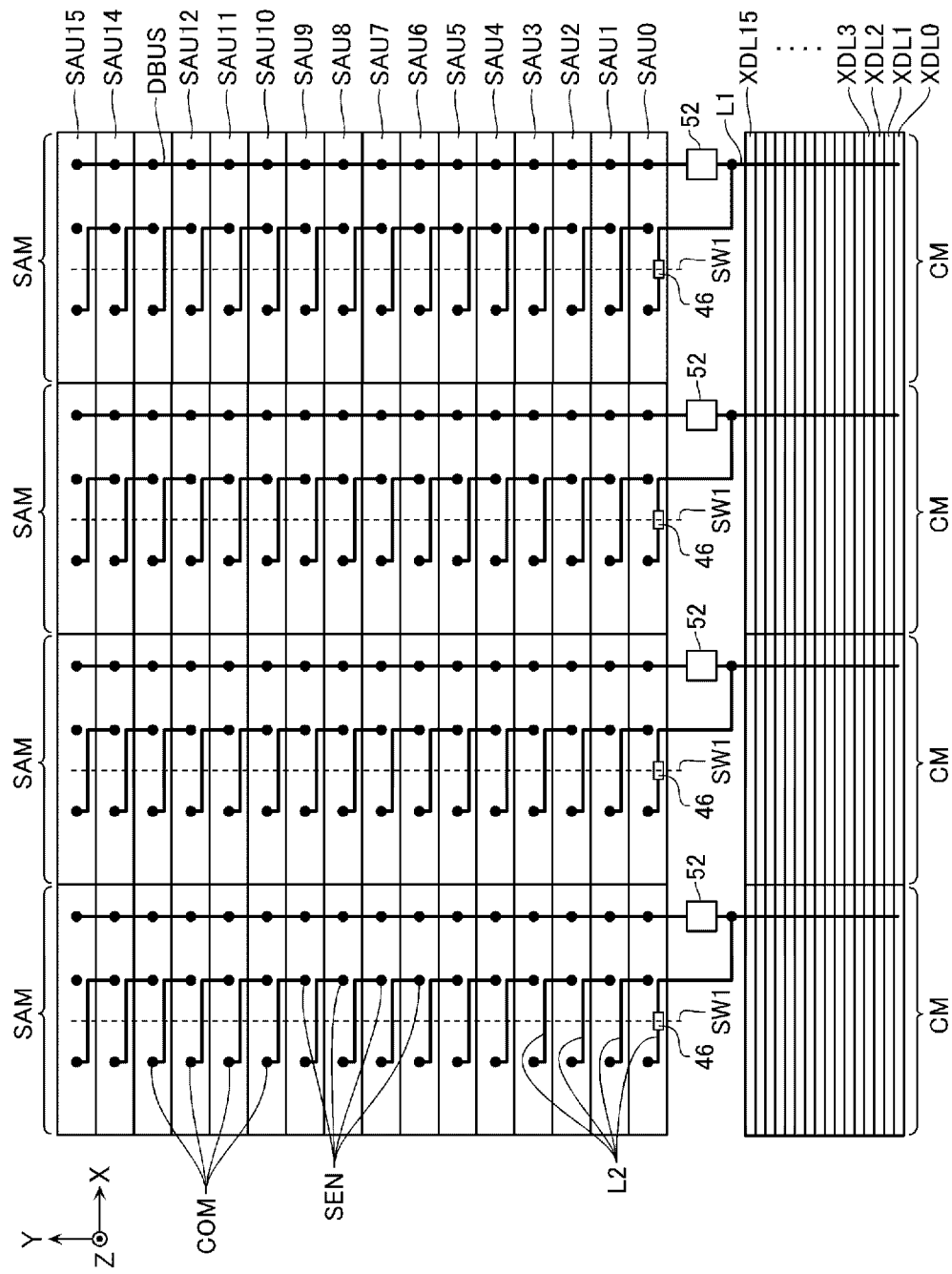
FIG. 10 is a schematic plan view showing the configuration of the sense amplifier module.

Next, a configuration example of the semiconductor storage device according to this embodiment will be described with reference to FIGS. 6 to 10. FIG. 6 is a schematic plan view of the semiconductor storage device according to this embodiment. FIG. 7 is a schematic enlarged view of a portion indicated by A in FIG. 6. FIG. 8 is a schematic cross-sectional view of a structure shown in FIG. 7 cut along a line B-B' and viewed in a direction of the arrow. FIG. 9 is a schematic enlarged view of FIG. 8. FIG. 10 is a schematic enlarged view of a portion indicated by C in FIG. 6. FIGS. 6 to 10 are schematic configurations, which may be illustrated differently as appropriate. In FIGS. 6 to 10, a part of the configuration is omitted.

As shown in FIG. 6, the semiconductor storage device according to this embodiment includes a semiconductor substrate 100. In the illustrated example, the semiconductor substrate 100 is provided with two memory cell arrays MCA arranged in an X direction. Parts of the row decoders RD are provided in regions extending in a Y direction along both ends in the X direction of the memory cell arrays MCA. The sense amplifier modules SAM and the cache memories CM are provided in regions extending in the X direction along an end in the Y direction of the memory cell arrays MCA. In a region near both the ends in the X direction of the regions where the sense amplifier modules SAM and the cache memories CM are provided, driver circuits DRV that are parts of the row decoders RD are provided. In a region outside these regions, the voltage generation circuit VG, the sequencer SQC, the input and output control circuit I/O, and the logic circuit CTR are provided.

The memory cell arrays MCA include a plurality of memory blocks MB arranged in the Y direction. As shown in FIG. 7, each of the memory blocks MB includes two sub-block structures SB arranged in the Y direction. An inter-block structure ST extending in the X direction is provided between the two sub-block structures SB adjacent in the Y direction. The word lines WL in the two memory blocks MB are separated in the Y direction via the inter-block structure ST.

Each of the sub-block structures SB includes two string units SU arranged in the Y direction, and an inter-sub-block insulation layer SHE provided between these two string units SU.

As illustrated in FIG. 8, the string unit SU includes a plurality of conductive layers 110 provided above the semiconductor substrate 100, a plurality of semiconductor layers 120, and a plurality of gate insulation films 130 provided respectively between the plurality of conductive layers 110 and the plurality of semiconductor layers 120.

The semiconductor substrate 100 is, for example, a semiconductor substrate such as single crystal silicon (Si) containing p-type impurities. A part of a surface of the semiconductor substrate 100 is provided with an N-type well containing N-type impurities such as phosphorus (P). A part of a surface of the N-type well is provided with a P-type well containing P-type impurities such as boron (B).

The conductive layers 110 are substantially plate-like conductive layers extending in the X direction, and are arranged in a Z direction. The conductive layer 110 may include, for example, a stacked film of titanium nitride (TiN) and tungsten (W), or may include polycrystalline silicon containing impurities such as phosphorus or boron. Insulation layers 111 such as silicon oxide ($SiO_2$) are provided between the conductive layers 110.

Among the plurality of conductive layers 110, one or a plurality of conductive layers 110 that are located lowest function as the source select line SGS (FIG. 3) and gate electrodes of the plurality of source select transistors STS are connected thereto. The plurality of conductive layers 110 located thereabove function as the word lines WL (FIG. 3) and the gate electrodes of the plurality of memory cells MC (FIG. 3) are connected thereto. The one or more conductive layers 110 located thereabove function as the drain select line SGD and gate electrodes of the plurality of drain select transistors STD (FIG. 3) are connected thereto. The plurality of conductive layers 110 that function as the drain select line SGD or the like are divided in the Y direction via the inter-sub-block insulation layer SHE.

As illustrated in FIG. 7, a plurality of semiconductor layers 120 are provided in the X direction and the Y direction. The semiconductor layer 120 is, for example, a semiconductor film such as non-doped polycrystalline silicon (Si). For example, as illustrated in FIGS. 7-8, the semiconductor layers 120 have a substantially cylindrical shape, and have insulation films 121 such as silicon oxide provided at centers thereof. Outer peripheral surface of the semiconductor layers 120 are surrounded by the conductive layers 110, respectively. Lower ends of the semiconductor layers 120 are connected to P-type wells of the semiconductor substrate 100 via semiconductor layers 122 such as non-doped single crystal silicon. The semiconductor layers 122 face the conductive layers 110 via insulation layers 123 such as silicon oxide. Upper ends of the semiconductor layers 120 are connected to the bit line BL via a semiconductor layer 124 containing N-type impurities such as phosphorus (P) and contacts Ch and Cb. The semiconductor layers 120 function as a channel region of the plurality of memory cells MC and the drain select transistor STD in one memory string MS (FIG. 3). The semiconductor layers 122 function as a partial channel region of the source select transistor STS.

For example, as illustrated in FIG. 9, each of the gate insulation films 130 includes a tunnel insulation film 131, a charge storage film 132, and a block insulation film 133 that are stacked between the semiconductor layer 120 and the conductive layers 110. The tunnel insulation film 131 and the block insulation film 133 are, for example, insulation films such as silicon oxide. The charge storage film 132 is, for example, a film capable of storing charges such as silicon nitride (SiN). The tunnel insulation film 131, the charge storage film 132, and the block insulation film 133 have substantially cylindrical shapes, and extend in the Z direction along an outer peripheral surface of the semiconductor layer 120.

Although FIG. 9 shows an example in which the gate insulation film 130 includes the charge storage film 132 such as silicon nitride, the gate insulation film 130 may include, for example, a floating gate such as polycrystalline silicon containing N-type or P-type impurities.

For example, as shown in FIG. 8, the inter-block structure ST includes a conductive layer LI extending in the Z direction and an insulation layer SW provided between the conductive layer LI and the plurality of conductive layers 110.

The conductive layer LI is a substantially plate-like conductive layer extending in the Z direction and the X direction, and functions as a part of the source line SL. The conductive layer LI may include, for example, a stacked film of titanium nitride (TiN) and tungsten (W), may include polycrystalline silicon containing impurities such as phosphorus or boron, or may include silicide or the like. The insulation layer SW is, for example, an insulation layer such as silicon oxide ($SiO_2$).

As shown in FIG. 10, in a partial region of the surface of the semiconductor substrate 100 (the region indicated by C in FIG. 6), the plurality of sense amplifier modules SAM arranged in the X direction and the plurality of cache memories CM arranged in the X direction corresponding thereto are provided. Each of the sense amplifier modules SAM includes the plurality of sense amplifier units SAU0 to SAU15 arranged in the Y direction, and the wiring DBUS extending in the Y direction and connected to the plurality of sense amplifier units SAU0 to SAU15. Each of the cache memories CM includes the plurality of latch circuits XDL0 to XDL15 arranged in the Y direction, and the wiring L1 extending in the Y direction and connected to the plurality of latch circuits XDL0 to XDL15.

As described with reference to FIGS. 4 and 5, the sense amplifier module SAM includes the sense amplifier units SAU0 to 15, and each of the sense amplifier units SAU0 to SAU15 includes the sense amplifier SA and the latch circuits SDL, ADL, BDL, and CDL. The cache memory CM includes the latch circuits XDL0 to XDL15. Here, the latch circuits SDL, ADL, BDL, CDL, and XDL0 to XDL15 can all be realized with a circuit area of the same size. Therefore, a circuit area of the sense amplifier module SAM is larger than a circuit area of the cache memory CM. A wiring length of the wiring DBUS is greater than a wiring length of the wiring L1.

[Read Operation]

Figure 11:
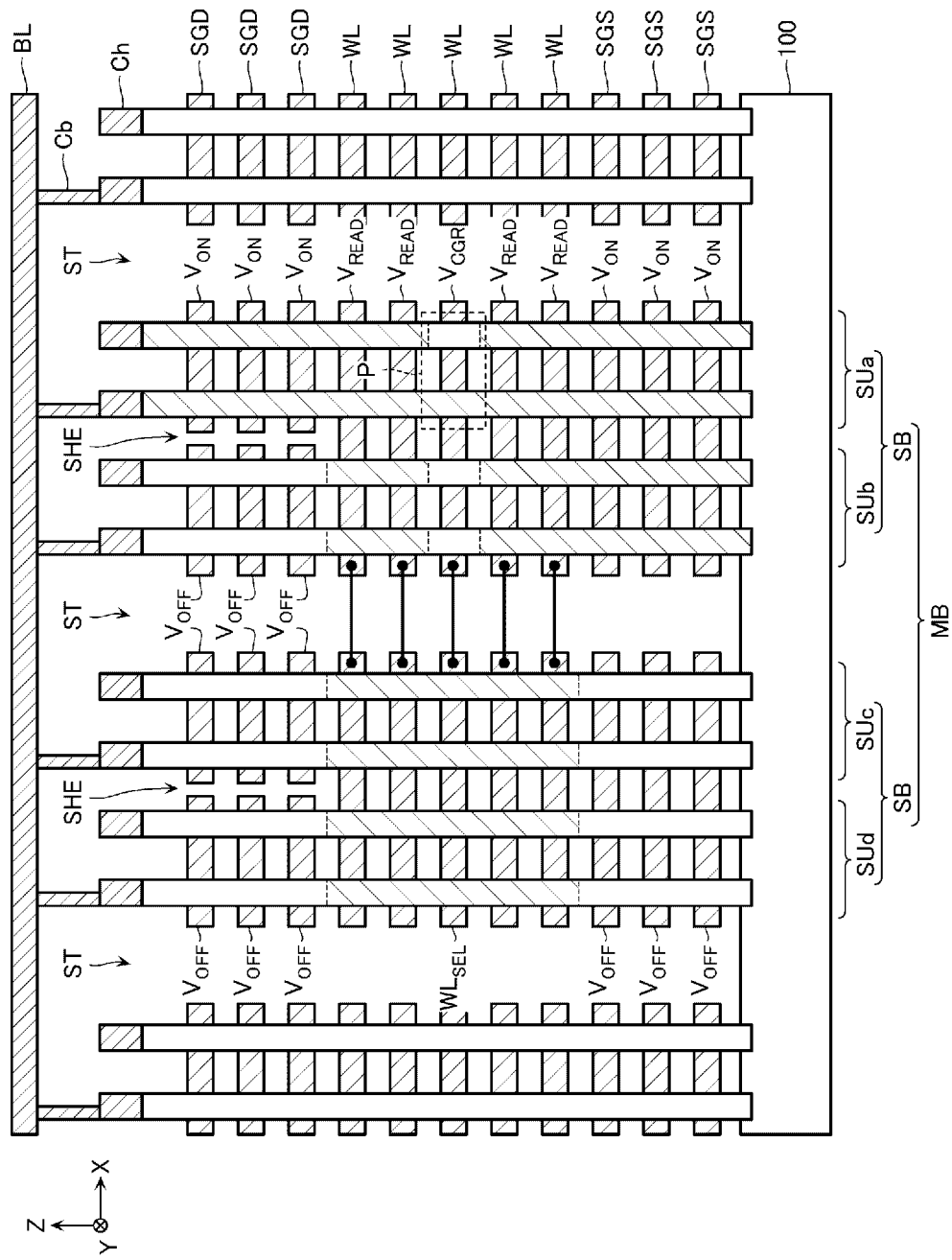
FIG. 11 is a schematic cross-sectional view illustrating a read operation.
Figure 12:
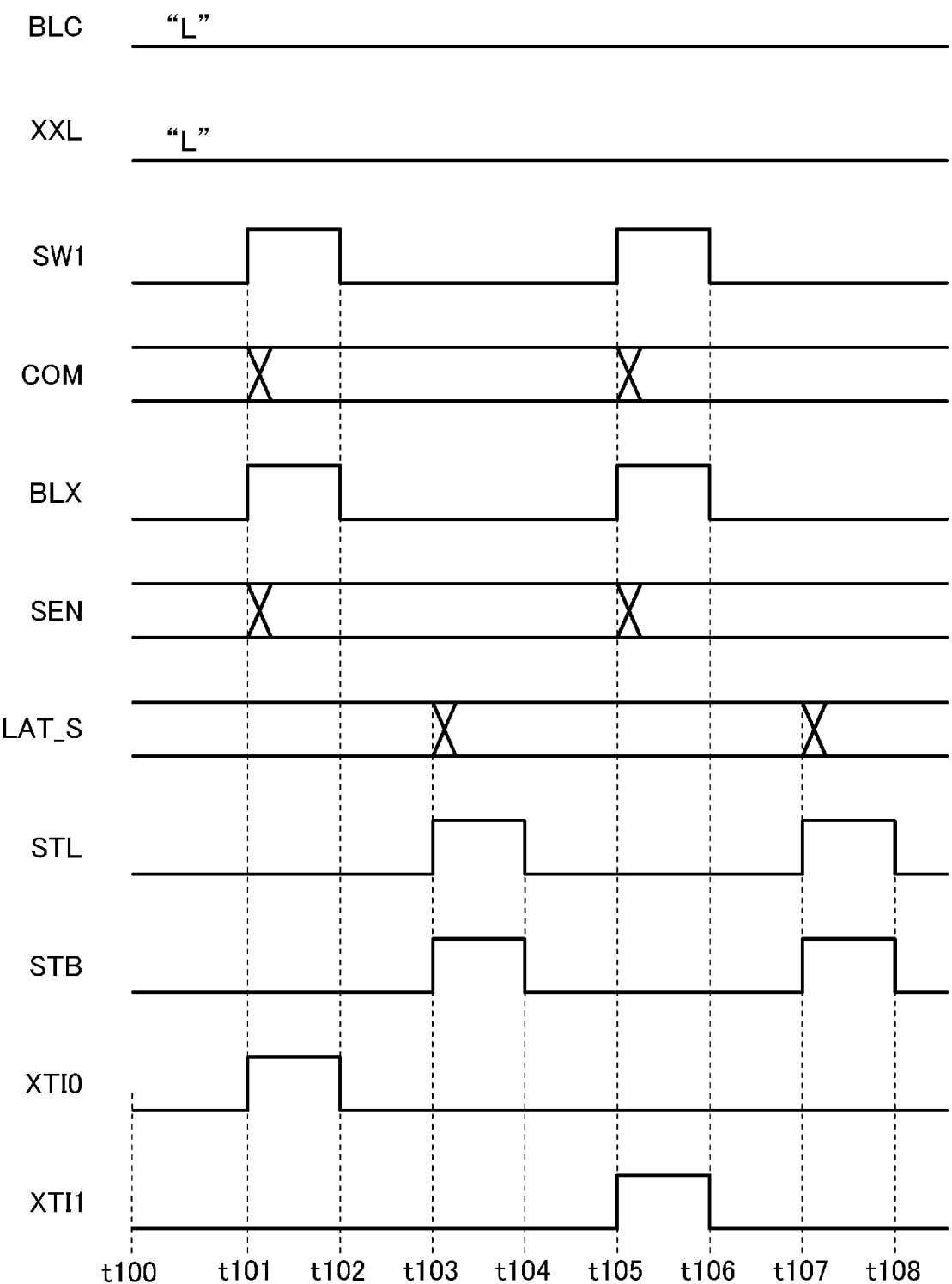
FIG. 12 is a schematic timing chart illustrating the read operation.

Next, a read operation of the semiconductor storage device according to this embodiment will be described with reference to FIGS. 11 to 13. FIG. 11 is a schematic cross-sectional view illustrating the read operation. FIG. 12 is a schematic timing chart illustrating the read operation. FIGS. 13A to 13D are schematic tables illustrating the read operation.

In the read operation, for example, as shown in FIG. 11, a plurality of selected memory cells MC in a selected page P are selectively conducted to the bit lines BL and the source line SL. For example, when the selected page P is in a string unit SUa, an ON voltage VON is supplied to the drain select line SGD and the source select line SGS corresponding to the string unit SUa, and the select transistors (STD, STS) are set to an ON state. An OFF voltage $V_{OFF}$ is supplied to other drain select lines SGD and source select lines SGS, and the select transistors (STD, STS) are set to an OFF state. A read pass voltage $V_{READ}$ is supplied to non-selected word lines WL corresponding to a non-selected page, and all the memory cells MC connected to the non-selected word lines WL are set to the ON state.

As shown in FIG. 11, a read voltage $V_{CGR}$ is supplied to the selected word line WL corresponding to the selected page P. Thus, a part of the memory cells MC are set to the ON state according to the threshold voltage of the memory cells MC, and other memory cells MC are set to the OFF state.

The sense amplifiers SA detect an ON/OFF state of the selected memory cells MC. For example, the wiring LBUS is charged via the charge transistor 45 in FIG. 5, the signal line STL is set to an "H" state, so as to cause the latch circuit SDL to latch "H". The signal lines HLL, BLX, and BLC are set to the "H" state, and charging of the bit line BL and the sense node SEN is started. The signal line HLL is switched from the "H" state to an "L" state, the signal line XXL is switched from the "L" state to the "H" state, and charges of the sense node SEN are discharged to the bit line BL. Here, a voltage of the sense nodes SEN connected to the bit lines BL corresponding to the memory cells MC in the ON state is reduced significantly. Meanwhile, a voltage of the sense nodes SEN connected to the bit lines BL corresponding to the memory cells MC in the OFF state is not reduced as much. Therefore, by setting the signal line STB to the "H" state at a predetermined timing to release or maintain the charges of the wiring LBUS and setting the signal line STL to the "H" state, data indicating a state of the selected memory cell MC is latched by the latch circuit SDL.

When the memory cell MC contains multi-value data such as 4-value, 8-value, 16-value, if necessary, a read operation with a plurality of read voltages $V_{CGR}$ is executed, so as to sequentially latch such data in the latch circuits ADL, BDL and CDL. A logical operation is performed between these latches, and data assigned to the memory cell MC is calculated and latched in the latch circuit SDL.

Next, for example, by a method illustrated in FIGS. 12 and 13A to 13D, data latched in the latch circuits SDL in the sense amplifier units SAU0 to SAU15 is transferred to the latch circuits XDL0 to XDL15 in the cache memory CM.

At a timing t100, for example, as shown in FIG. 12, the signal lines BLC, XXL, SW1, BLX, STL, STB, and XTI0 to XTI15 are all in the "L" state. For example, as shown in FIG. 13A, data DAT0 to DAT15 read out by the above operation are latched at the sense nodes SEN of the sense amplifier units SAU0 to SAU15 and the node LAT_S of the corresponding latch circuit SDL.

At a timing t101, for example, as shown in FIG. 12, the signal lines SW1, BLX, and XTI0 are in the "H" state. Accordingly, for example, the node N1 in the sense amplifier unit SAU14 illustrated in FIG. 5 is conducted to the sense node SEN in the sense amplifier unit SAU13. Here, a state of the node N1 in the sense amplifier unit SAU14 matches a state of the node LAT_S (a value latched in the latch circuit SDL) in the sense amplifier unit SAU14. Therefore, the data DAT14 is transferred to the sense node SEN in the sense amplifier unit SAU13. For example, as shown in FIG. 13B, the data DAT1 to DAT15 are transferred to the sense nodes SEN in the sense amplifier units SAU0 to SAU14. The data DAT0 is transferred to the latch circuit XDL0 in the cache memory CM.

At a timing t102, for example, as shown in FIG. 12, the signal lines SW1, BLX, and XTI0 are in the "L" state.

At a timing t103, for example, as shown in FIG. 12, the signal lines STL, and STB are in the "H" state. Accordingly, for example, as shown in FIG. 13C, the data DAT1 to DAT15 are transferred to the nodes LAT_S (the latch circuits SDL) in the sense amplifier units SAU0 to SAU14.

At a timing t104, for example, as shown in FIG. 12, the signal lines STL, and STB are in the "L" state.

At a timing t105, for example, as shown in FIG. 12, the signal lines SW1, BLX, and XTI1 are in the "H" state. Accordingly, for example, as shown in FIG. 13D, the data DAT2 to DAT15 are transferred to the sense nodes SEN in the sense amplifier units SAU0 to SAU13. The data DAT1 is transferred to the latch circuit XDL1 in the cache memory CM.

At a timing t106, for example, as shown in FIG. 12, the signal lines SW1, BLX, and =1 are in the "L" state.

At a timing t107, for example, as shown in FIG. 12, the signal lines STL, and STB are in the "H" state. Accordingly, the data DAT2 to DAT15 are transferred to the nodes LAT_S (the latch circuits SDL) in the sense amplifier units SAU0 to SAU13.

At a timing t108, for example, as shown in FIG. 12, the signal lines STL, and STB are in the "L" state.

Similarly, an operation corresponding to the timings t101 to t104 is executed 16 times, and the data DAT0 to DAT15 are transferred to the latch circuits XDL0 to XDL15 in the cache memory CM.

Comparative Example

[Configuration]

Figure 14:
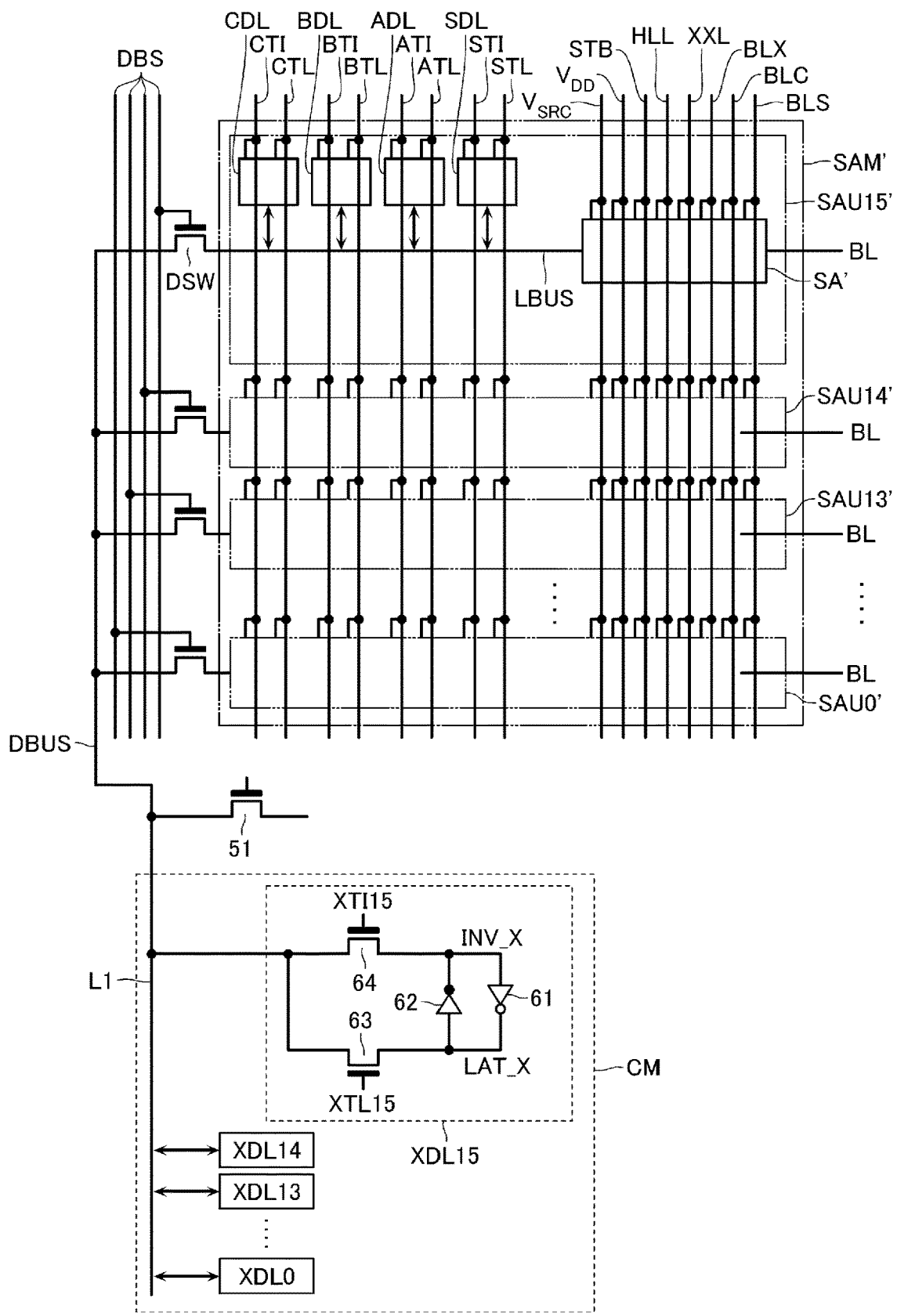
FIG. 14 is a schematic block diagram showing a configuration of a sense amplifier module according to a comparative example.
Figure 15:
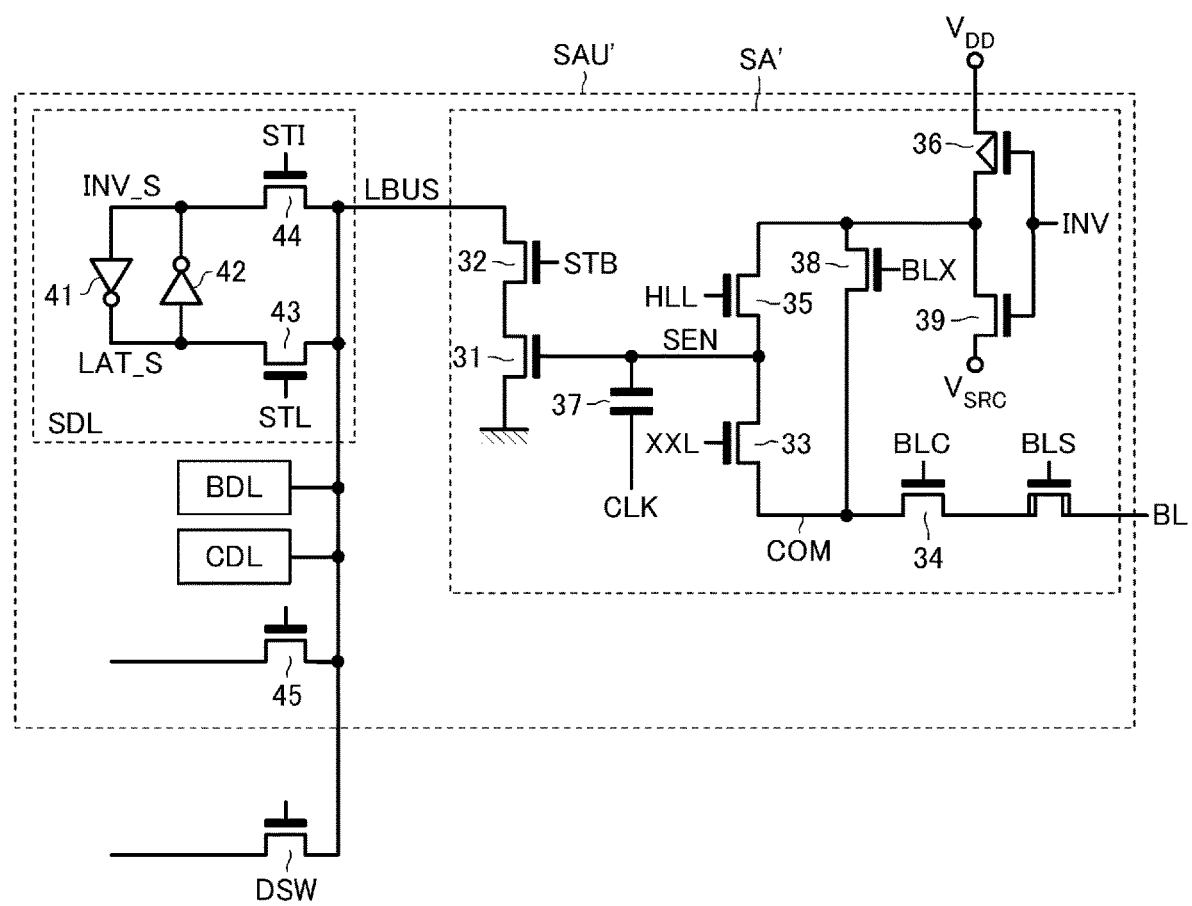
FIG. 15 is a schematic circuit diagram showing a configuration of a sense amplifier according to the comparative example.
Figure 16:
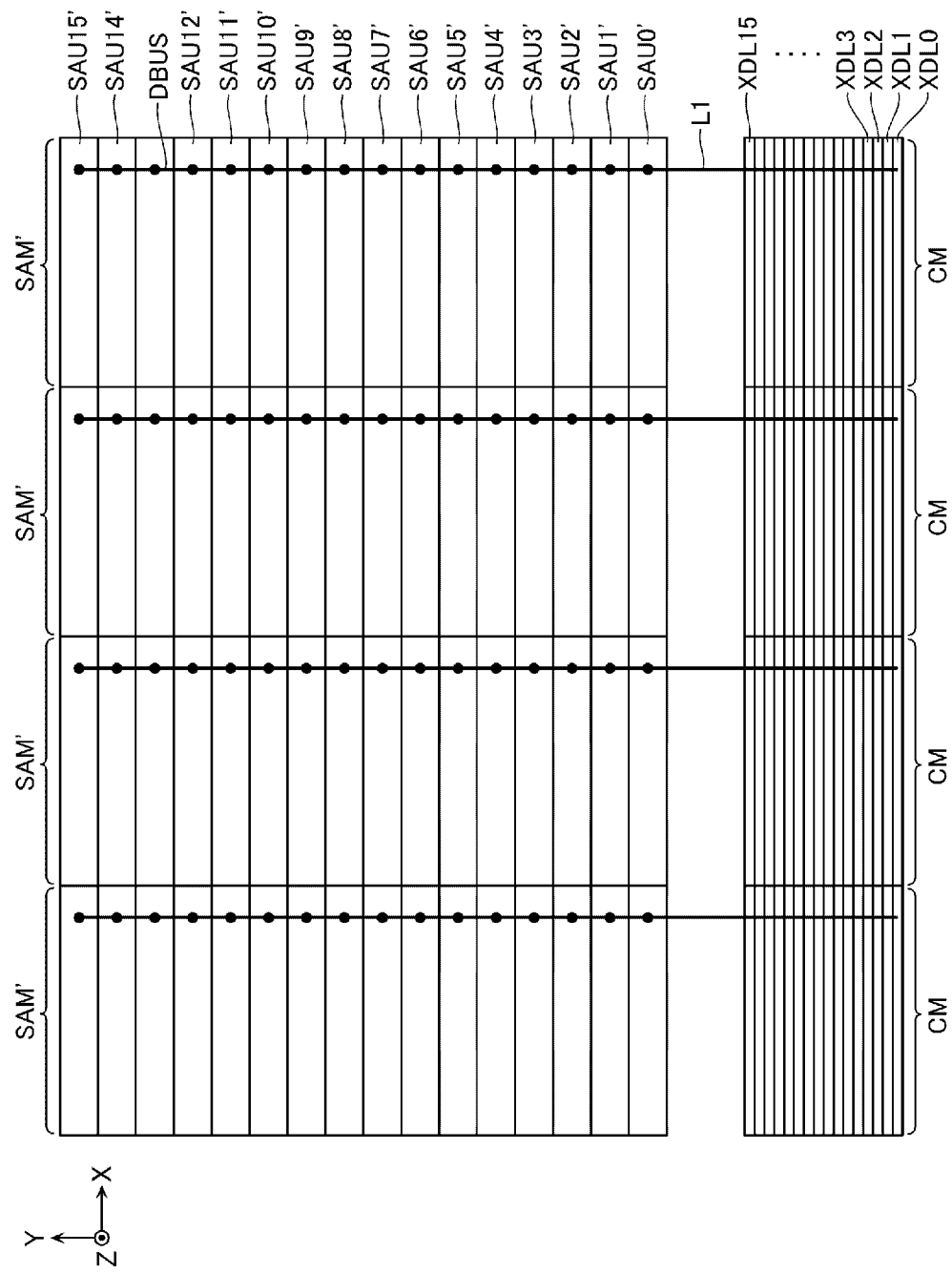
FIG. 16 is a schematic plan view showing a partial configuration of a semiconductor storage device according to the comparative example.

Next, a semiconductor storage device according to a comparative example will be described with reference to FIGS. 14 to 16. FIG. 14 is a schematic block diagram showing a configuration of a sense amplifier module SAM' according to a comparative example. FIG. 15 is a schematic circuit diagram showing a configuration of a sense amplifier SA' according to the comparative example. FIG. 16 is a schematic plan view showing a partial configuration of a semiconductor storage device according to the comparative example. In the following description, a similar configuration as those of the semiconductor storage device according to the first embodiment is denoted by the same reference numerals, and the description thereof is omitted.

As shown in FIG. 14, the sense amplifier module SAM' according to the comparative example is configured in a substantially similar manner as the sense amplifier module SAM (FIG. 4) according to the first embodiment. However, the sense amplifier module SAM' according to the comparative example does not include the switch transistor 52, and the wiring DBUS is directly connected to the wiring L1. The wiring L1 according to the comparative example is not connected to the node COM in a sense amplifier unit SAU0'.

As shown in FIG. 15, the sense amplifier SA' according to the comparative example is configured in a substantially similar manner as the sense amplifier SA (FIG. 5) according to the first embodiment. However, the sense amplifier SA' according to the comparative example does not include the wiring L2 and the switch transistor 46. The sense node SEN in any sense amplifier unit SAU is not connected to the node COM in another sense amplifier unit SAU either.

As shown in FIG. 16, sense amplifier units SAU0' to SAU15' according to the comparative example are arranged in a similar manner as the sense amplifier units SAU0 to SAU15 (FIG. 10) according to the first embodiment. The latch circuits XDL0 to XDL15 according to the comparative example are arranged in a similar manner as the latch circuits XDL0 to XDL15 according to the first embodiment. The wiring DBUS and the wiring L1 according to the comparative example are arranged in a similar manner as the wiring DBUS and the wiring L1 according to the first embodiment.

[Read Operation]

Next, a read operation of the semiconductor storage device according to the comparative example will be described. The read operation of the semiconductor storage device according to the comparative example is executed in a substantially similar manner as the read operation according to the first embodiment. However, a method for transferring the data in the sense amplifier module SAM to the cache memory CM is different.

In the comparative example, for example, first, the wiring LBUS is charged via the charge transistor 45 (FIG. 15). The wiring DBUS is charged via the charge transistor 51 (FIG. 14). Next, the wiring LBUS in the sense amplifier unit SAU0' is conducted to the wiring DBUS via the switch transistor DSW, and the signal line STI (FIG. 15) and the signal line XTI0 (FIG. 14) are set to the "H" state. Here, when the node LAT_S in the sense amplifier unit SAU0' is in the "L" state, the charges in the wirings LBUS and DBUS are discharged, and "L" is transferred to the latch circuit XDL0. On the other hand, when the node LAT_S in the sense amplifier unit SAU0' is in the "H" state, the charges in the wirings LBUS and DBUS are maintained, and "H" is transferred to the latch circuit XDL0.

Next, for example, the wiring LBUS is charged via the charge transistor 45 (FIG. 15). The wiring DBUS is charged via the charge transistor 51 (FIG. 14). Next, the wiring LBUS in the sense amplifier unit SAU1' is conducted to the wiring DBUS via the switch transistor DSW, and the signal line STI (FIG. 15) and the signal line XTI1 (FIG. 14) are set to the "H" state. Thus, "L" or "H" is transferred to the latch circuit XDL1.

Next, similarly, data latched in the latch circuits SDL in the sense amplifier units SAU0' to SAU15' is transferred to the latch circuits XDL0 to XDL15 in the cache memory CM.

[Effect of the Semiconductor Storage Device According to the First Embodiment]

As described above, in the semiconductor storage device according to the comparative example, while the data latched in the latch circuits SDL in the sense amplifier units SAU0' to SAU15' is transferred to the latch circuits XDL0 to XDL15 in the cache memory CM, charging and discharging of the wiring DBUS need to be executed 16 times. Here, as illustrated in FIG. 16, the wiring DBUS extends in the Y direction so as to be connected to the sense amplifier units SAU0' to SAU15', and has a longer wiring length than those of the other wirings. Therefore, the wiring DBUS has a larger capacitance, and when transferring data, the charging and discharging of the wiring DBUS may need a relatively longer time.

Here, in the semiconductor storage device according to this embodiment, as described with reference to FIG. 5, the node COM in the sense amplifier unit SAUk+1 is connected to the sense node SEN in the sense amplifier unit SAUk via the switch transistor 46 in the sense amplifier unit SAUk+1. The wiring L1 is connected to the node COM in the sense amplifier unit SAU0 via the switch transistor 46 in the sense amplifier unit SAU0.

According to such a configuration, in each sense amplifier unit SAU, the node COM is charged or discharged directly (without precharging operation) by a CMOS drive circuit that includes the charge transistor 37 made of PMOS and the discharge transistor 40 made of NMOS based on data stored in the node INV_S of the corresponding data latch circuit SDL. Therefore, as described above, the data of the sense amplifier unit SAUk+1 is sequentially transferred to the sense amplifier unit SAUk, and the data of the sense amplifier unit SAU0 is transferred to the latch circuits XDL0 to XDL15. According to such a method, the charging and discharging of the wiring DBUS can be omitted.

According to such a configuration, as described above, the sense node SEN in the sense amplifier unit SAUk is conducted to the voltage supply line $V_{DD}$ or the power supply voltage supply terminal $V_{SS}$ via the charge transistor 37 or the discharge transistor 40 in the sense amplifier unit SAUk+1, so as to transfer data. Since such a method is a direct charging or discharging operation performed by the CMOS driving circuit as described above, the method can be executed at a higher speed than a method of charging and discharging the wiring.

As described above, according to the semiconductor storage device of this embodiment, it is possible to significantly reduce a time required for data transfer compared to the comparative example, and it is possible to provide a semiconductor storage device that operates at a higher speed.

Second Embodiment

Figure 17:
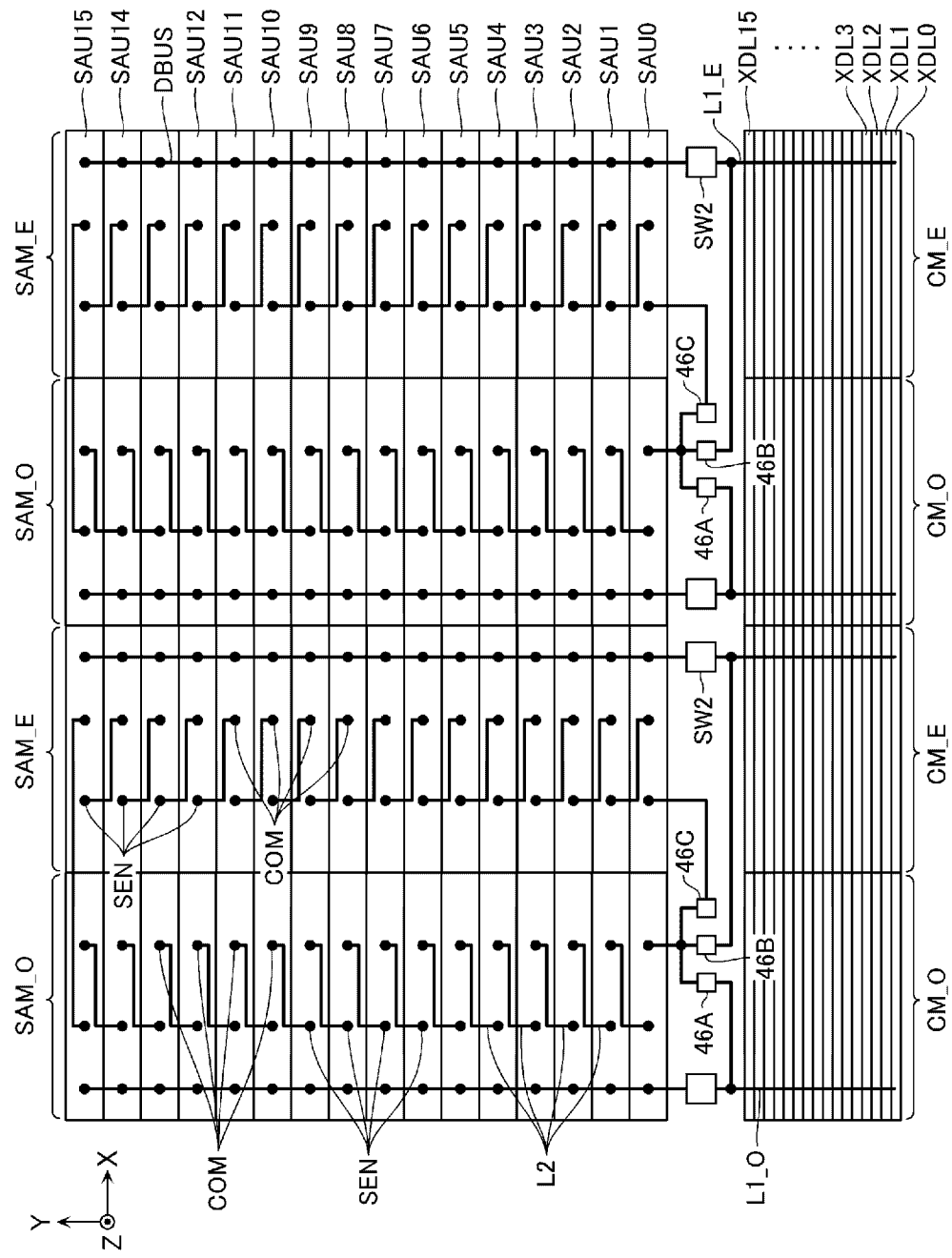
FIG. 17 is a schematic plan view showing a configuration of sense amplifier modules according to a second embodiment.
Figure 18:
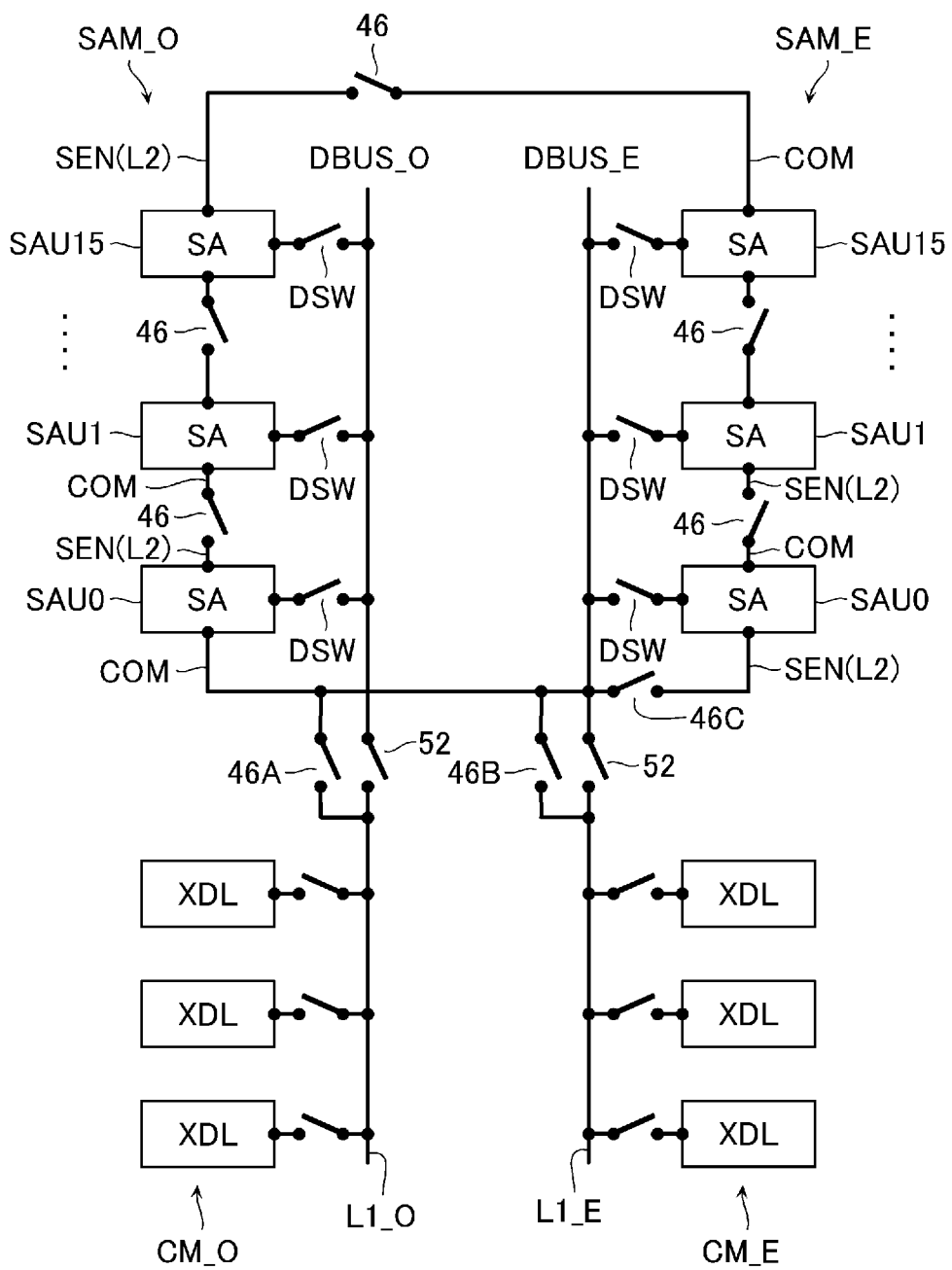
FIG. 18 is a schematic circuit diagram showing a configuration of the sense amplifier modules.

Next, a semiconductor storage device according to a second embodiment will be described with reference to FIGS. 17 to 19D. FIG. 17 is a schematic plan view showing a partial configuration of the semiconductor storage device according to the second embodiment. FIG. 18 is a schematic circuit diagram illustrating a read operation according to the second embodiment. FIGS. 19A to 19D are schematic tables illustrating the read operation according to the second embodiment. In the following description, the similar configuration as those of the semiconductor storage device according to the first embodiment is denoted by the same reference numerals, and the description thereof is omitted.

As described above, the semiconductor storage device according to the first embodiment can provide a semiconductor storage device that operates at the higher speed. However, in the first embodiment, for example, as shown in FIGS. 13A to 13D, as the data transfer proceeds, all the data in the latch circuits SDL in the sense amplifier units SAU0 to SAU15 are replaced with the data DAT15 in the sense amplifier unit SAU15. Here, in the read operation or the like, the data in the latch circuit SDL may be required to be left in the sense amplifier module SAM.

In order to leave the data of the latch circuits SDL in the sense amplifier module SAM, for example, in the first embodiment, it is conceivable to connect the sense node SEN in the sense amplifier unit SAU15 to the node COM in the sense amplifier unit SAU0.

According to such a configuration, the data DAT0 is transferred to the sense amplifier unit SAU15 at a timing when the data DAT1 to 15 are transferred to the sense amplifier units SAU0 to SAU14. The data DAT0 and DAT1 are transferred to the sense amplifier units SAU14 and SAU15 at a timing when the data DAT2 to 15 are transferred to the sense amplifier units SAU0 to SAU13. Hereinafter, similarly, the data DAT0 to DAT15 are circulated in the sense amplifier units SAU0 to SAU15 to prevent the data from being destroyed due to the transfer.

However, in such a configuration, the wiring L2 connected to the sense node SEN in the sense amplifier unit SAU15 and the node COM in the sense amplifier unit SAU0 may have the same length as the wiring DBUS, and may have a large capacitance. Thus, the data transfer may need more time.

Thus, in this embodiment, for example, as illustrated in FIG. 17, two sense amplifier modules SAM arranged in the X direction among the plurality of sense amplifier modules SAM arranged in the X direction are connected. For example, as illustrated in FIGS. 19A to 19D, data DAT0 (O) to DAT15 (O) stored in one sense amplifier module SAM_O are sequentially transferred to the cache memory CM and another sense amplifier module SAM_E. Data DAT15 (E) to DAT0 (E) stored in the other sense amplifier module SAM_E are sequentially acquired. Thus, the data is circulated between these two sense amplifier modules SAM_O and SAM_E. Thus, it is possible to prevent the data from being destroyed due to the transfer while suppressing the wiring length of all the wirings L2.

Hereinafter, among the plurality of sense amplifier modules SAM arranged in the X direction, an odd-numbered sense amplifier module SAM may be referred to as a sense amplifier module SAM_O, and an even-numbered sense amplifier module SAM may be referred to as a sense amplifier module SAM_E. Among the plurality of cache memories CM arranged in the X direction, an odd-numbered cache memory CM may be referred to as a cache memory CM_O, and an even-numbered cache memory CM may be referred to as a cache memory CM_E.

As illustrated in FIG. 17, in this embodiment, in the sense amplifier module SAM_O, the sense node SEN in the sense amplifier unit SAUk is connected to the node COM in the sense amplifier unit SAUk+1. The sense node SEN in the sense amplifier unit SAU15 of the sense amplifier module SAM_O is connected to the node COM in the sense amplifier unit SAU15 of the sense amplifier module SAM_E. In the sense amplifier module SAM_E, the sense node SEN in the sense amplifier unit SAUk+1 is connected to the node COM in the sense amplifier unit SAUk. The sense node SEN in the sense amplifier unit SAU0 of the sense amplifier module SAM_E is connected to the node COM in the sense amplifier unit SAU0 of the sense amplifier module SAM_O.

As illustrated in FIG. 18, in this embodiment, the node COM of the sense amplifier unit SAU0 of the sense amplifier module SAM_O is connected to a wiring L1_O in the cache memory CM_O via a switch transistor 46A, connected to a wiring L1_E in the cache memory CM_E via a switch transistor 46B, and connected to the sense node SEN of the sense amplifier unit SAU0 of the sense amplifier module SAM_E via a switch transistor 46C. The switch transistors 46A, 46B, and 46C are configured to be controllable independently from one another.

The read operation of the semiconductor storage device according to this embodiment is basically executed in a similar manner as the read operation of the semiconductor storage device according to the first embodiment. However, in this embodiment, operations corresponding to the timings t101 to t104 in FIG. 12 are executed 32 times. In a first 16 times, at a timing when the signal lines SW1 and BLX rise (a timing corresponding to the timing t101 in FIG. 12), the signal line connected to a gate electrode of the switch transistor 46A (FIG. 18) is set to the "H" state and the switch transistor 46A is set to the ON state. The signal line connected to a gate electrode of the switch transistor 46B is set to the "L" state, and the switch transistor 46B is set to the OFF state. The signal lines XTI0 to XTI15 are sequentially set to the "H" state in an order from XTI0 to XTI15. On the other hand, in a last 16 times, at the timing when the signal lines SW1 and BLX rise, the signal line connected to the gate electrode of the switch transistor 46A is set to the "L" state, and the switch transistor 46A is set to the OFF state. The signal line connected to the gate electrode of the switch transistor 46B is set to the "H" state, and the switch transistor 46B is set to the ON state. The signal lines XTI0 to XTI15 are sequentially set to the "H" state in an order from XTI15 to XTI0.

A configuration as shown in FIG. 17 is merely an example, and a specific configuration may be adjusted as appropriate. For example, in FIG. 17, a relationship between the sense node SEN and the node COM may be switched. A relationship between the sense amplifier modules SAM_O and SAM_E may be switched. A relationship between the cache memories CM_O and CM_E may be switched.

Third Embodiment

Figure 20A:
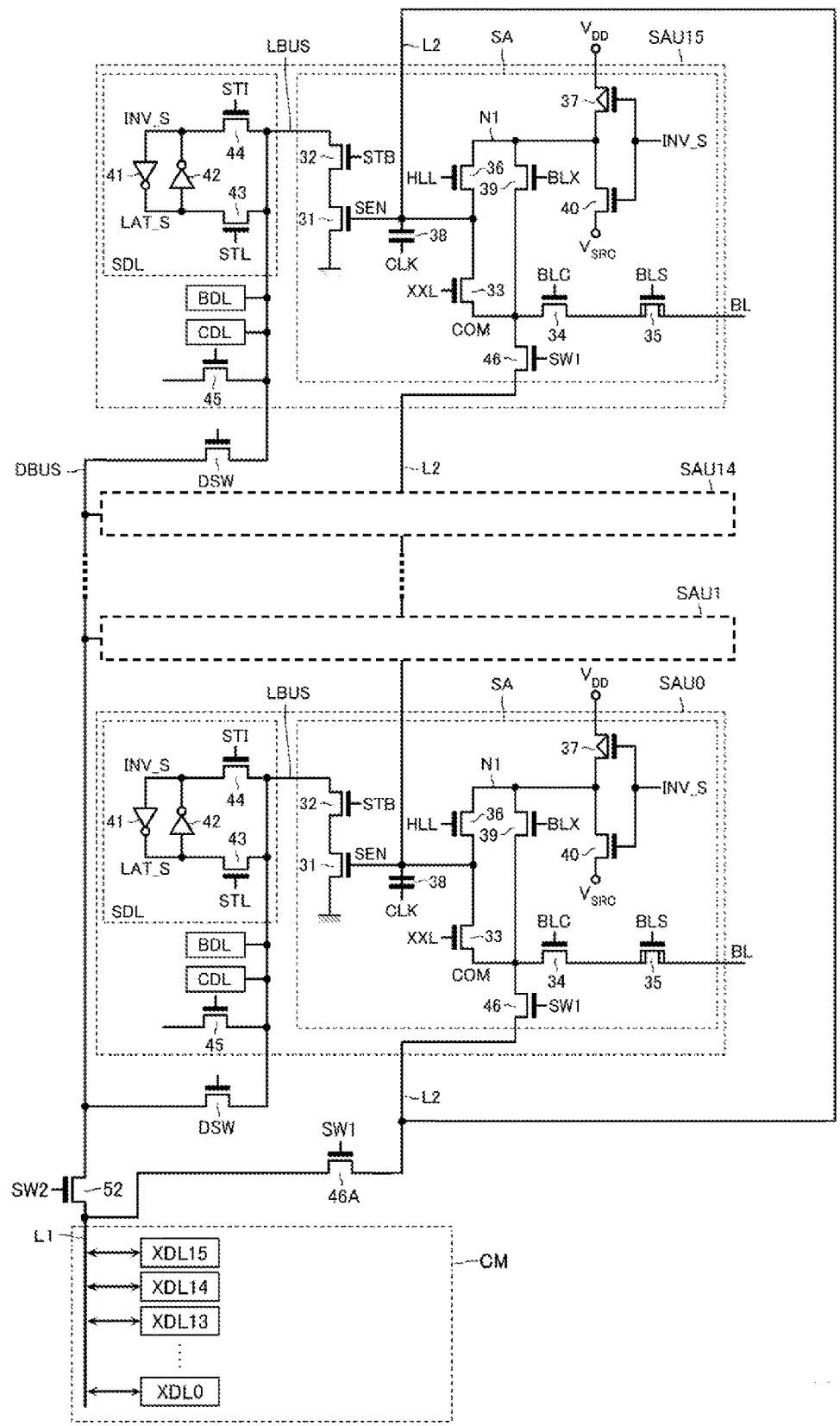
FIG. 20A is a schematic circuit diagram showing a configuration of a sense amplifier according to a third embodiment.
Figure 20B:
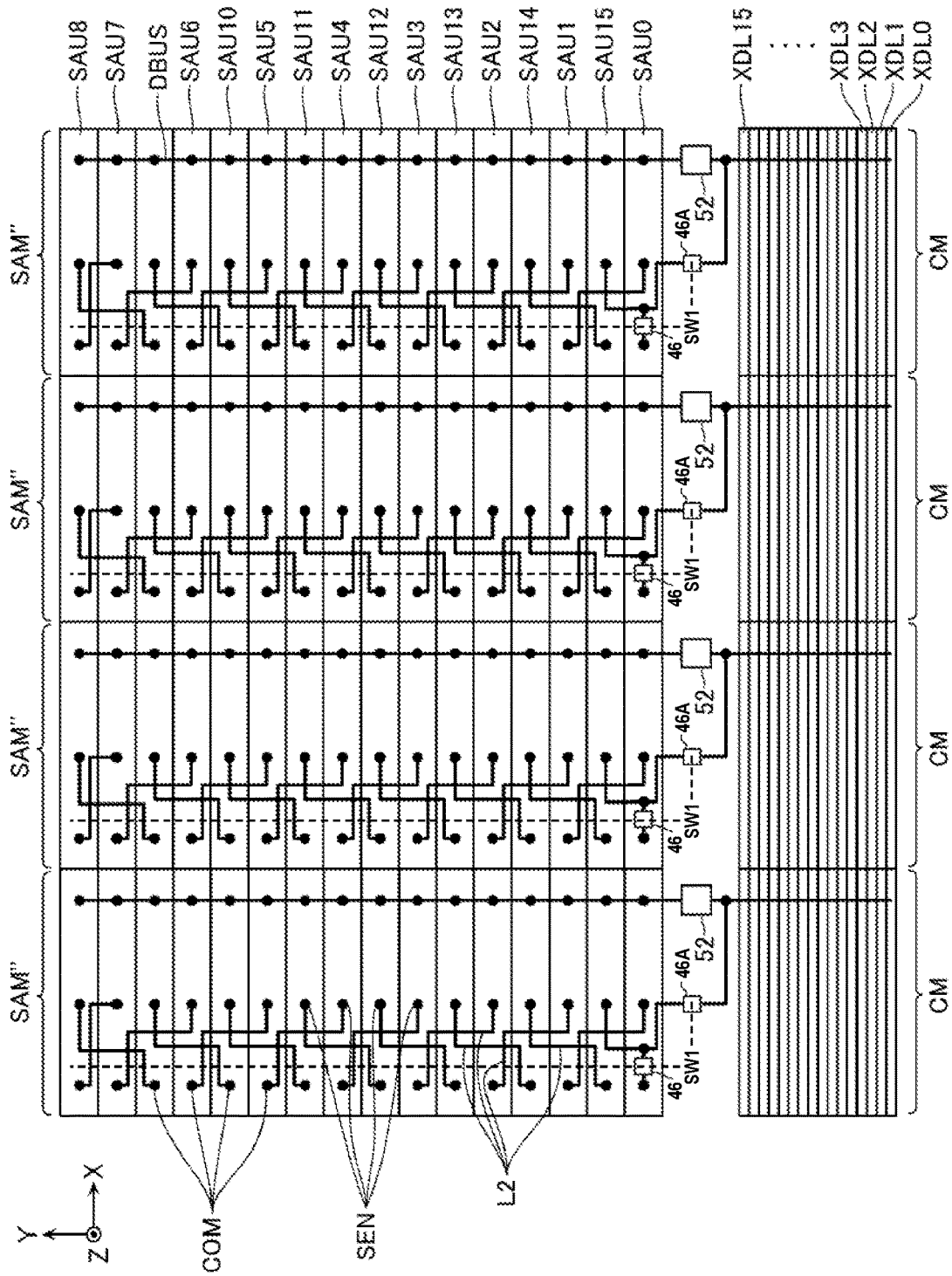
FIG. 20B is a schematic plan view showing a configuration of the sense amplifier module.

Next, a semiconductor storage device according to a third embodiment will be described with reference to FIGS. 20 and 21A to 21D. FIG. 20A is a schematic circuit diagram showing a configuration of the semiconductor storage device according to the third embodiment, and FIG. 20B is a schematic plan view showing a partial configuration of the semiconductor storage device according to the third embodiment. FIGS. 21A to 21D are schematic tables illustrating the read operation according to the third embodiment. In the following description, the similar configuration as those of the semiconductor storage device according to the first embodiment is denoted by the same reference numerals, and the description thereof is omitted.

As described above, according to the semiconductor storage device according to the second embodiment, it is possible to prevent the data from being destroyed due to the transfer. However, in the first embodiment, the data of the sense amplifier module SAM is transferred to the cache memory CM in 16 times. On the other hand, in the second embodiment, the data of the sense amplifier modules SAM_O and SAM_E are transferred to the cache memories CM_O and CM_E in 32 times. Therefore, compared to the first embodiment, data transfer may take more time.

In this embodiment, the plurality of sense amplifier units SAU0 to SAU15 are not arranged in order along the Y direction, unlike to the first embodiment and the second embodiment. Instead, for example, as illustrated in FIG. 20B, the plurality of sense amplifier units SAU0 to SAU15 are arranged such that a sense amplifier unit SAU which is arranged at a j-th position (j being an integer from 2 to 15) from one side in the Y direction is not connected to an adjacent sense amplifier unit SAU is arranged at a (j+1)-th or (j−1)-th position, but is connected to a sense amplifier unit SAU is arranged at a (j+2)-th or (j−2)-th position. In the other words, the node COM of the sense amplifier unit SAU at the j-th position is connected to the node SEN of the sense amplifier unit SAU at the (j+2)-th or the (j−2)-th position via the switch transistor 46. Meanwhile, the sense amplifier units SAU0 and SAU8 arranged at the 1st and 16th positions in the Y direction are connected to the adjacent sense amplifier units SAU15 and SAU7 arranged at the 2nd and 15th in the Y direction, respectively. More specifically, the node COM of the sense amplifier unit SAU8 arranged at one end in the Y direction is connected to the node SEN of the adjacent sense amplifier unit SAU7 via the switch transistor 46. In addition, the node COM of the sense amplifier unit SAU0 arranged at the other end in the Y direction is connected to the node SEN of the adjacent sense amplifier unit SAU15 via the switch transistor 46. Therefore, the sense amplifier units SAU0 to SAU15 are arranged and connected so as to form an imaginary circle, while suppressing each of the wirings L2 not to stride over two or more sense amplifier units. The node COM of the sense amplifier unit SAU0 which is closest to the cache memory CM is further connected to the wiring L1 of the cache memory CM via the switch transistor 46 and the switch transistor 46A. The signal line SW1 connected to the gates of the switch transistors 46 of the sense amplifier units SAU0 to SAU15 is also connected to a gate of the switch transistor 46A. For example, as illustrated in FIGS. 21A to 21D, the data is circulated among the 16 sense amplifier units SAU0 to SAU15 in one sense amplifier module SAM. Thus, it is possible to prevent the data from being destroyed due to the transfer while suppressing the wiring length of each of the wirings L2 as in the second embodiment. The data transfer can be performed in a substantially similar sequence as illustrated in FIG. 12 in connection with the first embodiment.

As illustrated in FIG. 20B, in a sense amplifier module SAM" according to this embodiment, the sense node SEN in the sense amplifier unit SAUk is connected to the node COM in the sense amplifier unit SAUk+1 in a similar manner as in the first embodiment. However, in this embodiment, the sense node SEN in the sense amplifier unit SAU15 is connected to the node COM in the sense amplifier unit SAU0. A sense amplifier unit SAU15−n (n is an integer of 0 or more and 6 or less) is arranged between a sense amplifier unit SAUn and a sense amplifier unit SAUn+1. The sense amplifier unit SAU7 is arranged between the sense amplifier units SAU8 and SAU9.

The read operation of the semiconductor storage device according to this embodiment is executed in a similar manner as the read operation of the semiconductor storage device according to the first embodiment.

Configurations as shown in FIGS. 20A and 20B are merely examples, and a specific configuration may be adjusted as appropriate. For example, in FIGS. 20A and 20B, the relationship between the sense node SEN and the node COM may be switched.

Other Embodiments

The semiconductor storage device according to the embodiments has been described above. However, the above description is merely an example, and the above configuration, method, and the like may be adjusted as appropriate.

Figure 22:
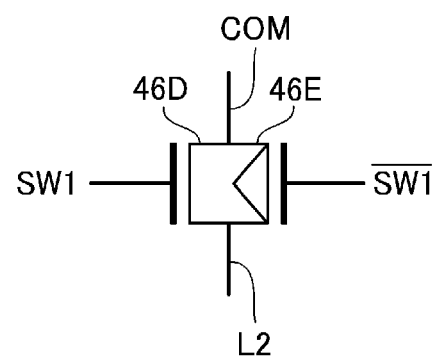
FIG. 22 is a schematic circuit diagram showing a partial configuration of a semiconductor storage device according to a modification.

For example, in the above embodiment, an example in which NMOS transistors are used as the switch transistor 46 (FIG. 5) and the switch transistor 52 (FIG. 4) is described. However, the switch transistors 46 and 52 can be replaced with, for example, an NMOS transistor 46D and a PMOS transistor 46E connected in parallel as illustrated in FIG. 22. A gate electrode of the NMOS transistor 46D is connected to the sequencer SQC via the signal line SW1. A gate electrode of the PMOS transistor 46E is connected to the sequencer SQC via a signal line /SW1. An inverted signal of the signal line SW1 is input to the signal line /SW1. According to such a configuration, a voltage of the voltage supply line $V_{SRC}$ can be suitably transferred by the NMOS transistor 46D. Further, a voltage of the voltage supply line $V_{DD}$ can be suitably transferred by the PMOS transistor 46E.

In the second and third embodiments, examples in which the data is transferred from the sense amplifier modules SAM_0, SAM_E, SAM" to the cache memories CM_0, CM_E, CM are described. However, in the second and third embodiments, it is conceivable to transfer the data from the cache memories CM_0, CM_E, CM to the sense amplifier modules SAM_0, SAM_E, SAM". Thus, it is conceivable to, for example, not set XTI0 to XTI15 to the "H" state in a period corresponding to the timings t101 to t102 in FIG. 12, but set XTI0 to XTI15 to the "H" state in a period corresponding to the timings t103 to t104.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a memory cell array including a plurality of memory cells and a plurality of bit lines connected to the plurality of memory cells;
a plurality of sense amplifier units that are respectively connected to the plurality of bit lines and that each include a first transistor connected to one of the bit lines, a second transistor connected to the first transistor via a first wiring, a sense transistor including a gate electrode connected to the second transistor via a second wiring, a third wiring connected to the sense transistor, a first latch circuit connected to the third wiring, and a voltage transfer circuit configured to conduct the first wiring to a first voltage supply line or a second voltage supply line according to a value latched by the first latch circuit;

a fourth wiring commonly connected to the third wirings of the plurality of sense amplifier units;
a cache memory including a fifth wiring connected to the fourth wiring and a plurality of second latch circuits connected to the fifth wiring;
a third transistor connected to the first wiring of a first sense amplifier unit among the plurality of sense amplifier units and the fifth wiring of the cache memory; and
a fourth transistor connected to the first wiring of a second sense amplifier unit among the plurality of sense amplifier units and the second wiring of the first sense amplifier unit.

2. The semiconductor storage device according to claim 1, comprising:
a fifth transistor connected to the first wiring of the first sense amplifier unit and the fifth wiring of the cache memory; and
a sixth transistor connected to the first wiring of the second sense amplifier unit and the second wiring of the first sense amplifier unit, wherein
one of the third transistor and the fifth transistor is an NMOS transistor and the other is a PMOS transistor, and
one of the fourth transistor and the sixth transistor is an NMOS transistor, and the other is a PMOS transistor.

3. The semiconductor storage device according to claim 1, comprising:
M sense amplifier units arranged in order along a first direction (M is an integer of 2 or more), from the first sense amplifier unit to the M-th sense amplifier unit; and
M−1 fourth transistors each connected to the first wiring of a K-th (K is an integer of one or more and M−1 or less) sense amplifier unit and the second wiring of a K+1-th sense amplifier unit.

4. The semiconductor storage device according to claim 1, comprising:
a plurality of sense amplifier modules each including the plurality of sense amplifier units arranged along a first direction, wherein the sense amplifier modules are arranged along a second direction intersecting the first direction;
a seventh transistor connected to the first wiring of one of the sense amplifier units in a first sense amplifier module of the plurality of sense amplifier modules and the second wiring of one of the sense amplifier units in a second sense amplifier module of the plurality of sense amplifier modules; and
an eighth transistor connected to the first wiring of one of the sense amplifier units in the second sense amplifier module and the second wiring of one of the sense amplifier units in the first sense amplifier module.

5. The semiconductor storage device according to claim 1, comprising:
a ninth transistor connected to the first wiring of a third sense amplifier unit among the plurality of sense amplifier units and the second wiring of the second sense amplifier unit; and
a tenth transistor connected to the first wiring of the first sense amplifier unit and the second wiring of a fourth sense amplifier unit among the plurality of sense amplifier units; and
an eleventh transistor connected to the first wiring of the fourth sense amplifier unit and the second wiring of a fifth sense amplifier unit of the plurality of sense amplifier units.

6. The semiconductor storage device according to claim 5, wherein
the plurality of sense amplifier units are arranged in a first direction, wherein
the second sense amplifier unit is farther from the cache memory than the first sense amplifier unit,
the third sense amplifier unit is farther from the cache memory than the second sense amplifier unit,
the fourth sense amplifier unit is between the first sense amplifier unit and the second sense amplifier unit, and
the fifth sense amplifier unit is between the second sense amplifier unit and the third sense amplifier unit.

7. A method of transferring data from a plurality of sense amplifier units of a semiconductor storage device to a cache memory of the semiconductor storage device, wherein the plurality of sense amplifier units, including first and second sense amplifier units, are arranged along a first direction at increasing distances away from the cache memory, comprising:
transferring first data from a first bit line onto a first sense node of the first sense amplifier unit and second data from a second bit line onto a second sense node of the second sense amplifier unit;
latching the first data in a first latch of the first sense amplifier unit and the second data in a second latch of the second sense amplifier unit;
transferring the first data from the first sense amplifier unit to the cache memory; and
transferring the second data from the second sense amplifier unit onto the first sense node of the first sense amplifier unit.

8. The method according to claim 7, wherein the first sense amplifier unit is closest to the cache memory and the second sense amplifier unit is next closest to the cache memory.

9. The method according to claim 7, wherein the first sense amplifier unit is closest to the cache memory and another of the sense amplifier units is between the first and second sense amplifier units.

10. The method according to claim 7, further comprising:
after transferring the second data from the second sense amplifier unit onto the first sense node of the first sense amplifier unit, latching the second data in the first latch of the first sense amplifier unit, and transferring the second data from the first sense amplifier unit to the cache memory.

11. The method according to claim 7, further comprising:
transferring the first data from the first sense amplifier unit to a third sense node of a third sense amplifier unit, which is another one of the sense amplifier units; and
latching the first data in a third latch of the third sense amplifier unit.

12. The method according to claim 7, wherein
after the data of all of the sense amplifier units have been transferred to the cache memory, neither the first data nor the second data is preserved in any of the sense amplifier units.

13. The method according to claim 7, wherein
after the data of all of the sense amplifier units have been transferred to the cache memory, each of the first data and the second data is preserved in one of the sense amplifier units.

14. A method of transferring data from a plurality of sense amplifier units of a semiconductor storage device to a cache memory of the semiconductor storage device, wherein the plurality of sense amplifier units include first and second sense amplifier units that are in a first group of the sense amplifier units that are arranged along a first direction at increasing distances away from the cache memory and third and fourth sense amplifier units that are in a second group of the sense amplifier units that are arranged along the first direction at increasing distances away from the cache memory, comprising:

transferring first data from a first bit line onto a first sense node of the first sense amplifier unit, second data from a second bit line onto a second sense node of the second sense amplifier unit, third data from a third bit line onto a third sense node of the third sense amplifier unit, and fourth data from a fourth bit line onto a fourth sense node of the fourth sense amplifier unit;

latching the first, second, third, and fourth data in a first latch of the first sense amplifier unit, a second latch of the second sense amplifier unit, a third latch of the third sense amplifier unit, and a fourth latch of the fourth sense amplifier unit, respectively; and transferring the first data from the first sense amplifier unit to the cache memory and the third sense node of the third sense amplifier unit, while transferring the second data from the second sense amplifier unit to the first sense node of the first sense amplifier unit and the third data from the third sense amplifier unit to the fourth sense node of the fourth sense amplifier unit.

15. The method according to claim 14, wherein
among the first group of sense amplifier units, the first sense amplifier unit is closest to the cache memory and the second sense amplifier unit is next closest to the cache memory, and
among the second group of sense amplifier units, the third sense amplifier unit is closest to the cache memory and the fourth sense amplifier unit is next closest to the cache memory.

16. The method according to claim 15, wherein
the first group of sense amplifier units include a fifth sense amplifier unit and the second group of sense amplifier units include a sixth sense amplifier unit, and
while the first data is transferred from the first sense amplifier unit to the cache memory and the third sense node of the third sense amplifier unit, data is transferred from the sixth sense amplifier unit to a sense node of the fifth sense amplifier unit.

17. The method according to claim 16, wherein
the fifth sense amplifier unit is farthest from the cache memory among the first group of sense amplifier units, and
the sixth sense amplifier unit is farthest from the cache memory among the second group of sense amplifier units.

18. The method according to claim 14, further comprising:
after transferring the second data from the second sense amplifier unit onto the first sense node of the first sense amplifier unit, latching the second data in the first latch of the first sense amplifier unit, and transferring the second data from the first sense amplifier unit to the cache memory and the third sense node of the third sense amplifier unit.

19. The method according to claim 14, wherein
the cache memory includes a first group of latch circuits in which the data of the sense amplifier units in the first group are latched and a second group of latch circuits in which the data of the sense amplifier units in the second group are latched.

20. The method according to claim 19, further comprising:
after all data of the sense amplifier units in the first group are latched in the first group of latch circuits, operating a switch so that data is transferred from the first sense amplifier to the second group of latch circuits instead of the first group of latch circuits.

* * * * *